United States Patent
Wu et al.

[11] Patent Number: 6,045,671
[45] Date of Patent: Apr. 4, 2000

[54] SYSTEMS AND METHODS FOR THE COMBINATORIAL SYNTHESIS OF NOVEL MATERIALS

[75] Inventors: Xin Di Wu, San Jose; Youqi Wang, Palo Alto; Isy Goldwasser, Menlo Park, all of Calif.

[73] Assignee: Symyx Technologies, Inc., Santa Clara, Calif.

[21] Appl. No.: 08/841,423

[22] Filed: Apr. 22, 1997

Related U.S. Application Data

[63] Continuation-in-part of application No. 08/327,513, Oct. 18, 1994, Pat. No. 5,985,356, and a continuation-in-part of application No. 08/438,043, May 8, 1995, Pat. No. 5,776,359.

[51] Int. Cl.$^7$ .............................. C23C 14/34; C23C 14/04
[52] U.S. Cl. ................................ 204/298.11; 204/298.13; 118/504; 118/720
[58] Field of Search .......................... 204/298.09, 298.11, 204/298.23, 298.28, 298.29, 298.25, 298.13; 118/504, 720, 724, 725, 730

[56] References Cited

U.S. PATENT DOCUMENTS

| | | | |
|---|---|---|---|
| 3,048,146 | 8/1962 | Coppola | 118/504 |
| 3,193,408 | 7/1965 | Triller | 118/720 |
| 3,616,451 | 10/1971 | Gallez | 204/298.25 |
| 4,303,489 | 12/1981 | Morrison, Jr. | 204/298.11 |
| 4,388,034 | 6/1983 | Takahashi | 204/298.25 |
| 4,478,174 | 10/1984 | Ranger | 118/720 |
| 4,814,056 | 3/1989 | Welty | 204/298.11 |
| 4,818,561 | 4/1989 | Strahl | 204/298.27 |

FOREIGN PATENT DOCUMENTS

| | | | |
|---|---|---|---|
| 4037580 | 6/1991 | Germany | 204/293.23 |
| 63-266062 | 11/1988 | Japan | 204/298.11 |
| WO96/11878 | 4/1996 | WIPO . | |

OTHER PUBLICATIONS

International Search Report dated Aug. 17, 1998 with International Application No. PCT/US 98/07799, Filing Date Apr. 20, 1998.
J.J. Hanak; "Electroluminescence in ZnS: $Mn_x$: $Cu_y$ rf–Sputtered Films," Proc. $6^{th}$ Internl. Vacuum Congr. (1974); *Japan J. Appl. Phys. Suppl.1* 2 Pt. 1, (1974), pp. 809–812.
J.J. Hanak; "The 'Multiple–Sample Concept' in MateriaLs ResearcH: Synthesis, Compositional Analysis and Testing of Entire Multicomponent Systems," *Journal of Materials Science* (1970), pp. 964–971.
J.J. Hanak; "Calculation of Composition of Dilute Cosputtered Multicomponent Films," *J. Appl. Phys.*, vol. 44, No. 11 (Nov. 1973), pp. 5142–5147.
J.J Hanak, "Compositional Determination of rf Co–Sputtered Multicomponent Systems," *The Journal of Vacuum Science and Technology*, vol. 8, (1971) pp. 172–175.

(List continued on next page.)

*Primary Examiner*—Rodney McDonald

[57] ABSTRACT

Methods and apparatus for the preparation of a substrate having an array of diverse materials in predefined regions thereon. A substrate having an array of diverse materials thereon is generally prepared by depositing components of target materials to predefined regions on the substrate, and, in some embodiments, simultaneously reacting the components to form at least two resulting materials. In particular, the present invention provides novel masking systems and methods for applying components of target materials onto a substrate in a combinatorial fashion, thus creating arrays of resulting materials that differ slightly in composition, stoichiometry, and/or thickness. Using the novel masking systems of the present invention, components can be delivered to each site in a uniform distribution, or in a gradient of stoichiometries, thicknesses, compositions, etc. Resulting materials which can be prepared using the methods and apparatus of the present invention include, for example, covalent network solids, ionic solids and molecular solids. Once prepared, these resulting materials can be screened sequentially, or in parallel, for useful properties including, for example, electrical, thermal, mechanical, morphological, optical, magnetic, chemical and other properties.

11 Claims, 17 Drawing Sheets

OTHER PUBLICATIONS

J.J. Hanak, et al.; "The Effect of Grain Size on the Superconducting Transition Temperature of the Transition Metals," *Physics Letters*, vol. 30A, No. 3 (Oct. 6, 1969), pp. 201–202.

J.J. Hanak, et al.; "Radio–Frequency–Sputtered Films ofβ–Tungsten Structure Compounds," *Journal of Applied Physics*, vol. 41, No. 12 (Nov. 1970), 4958–4962.

E.M. DaSilva, et al. "Variable Thin Film Thickness Apparatus," *IBM Technical Disclosure*, vol. 22, No. 7 (Dec. 1979).

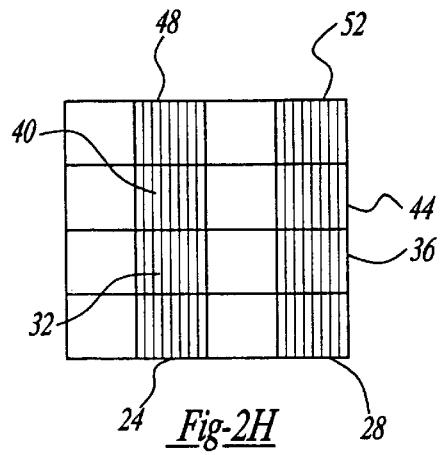
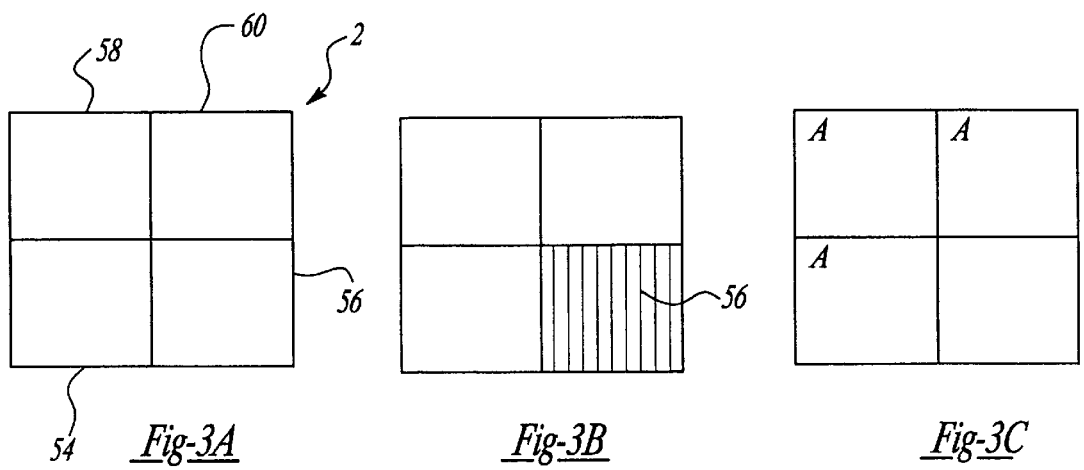
Fig-2G    Fig-2H    Fig-2I
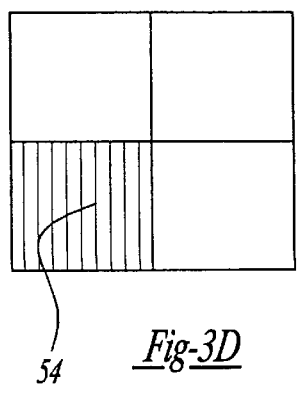
Fig-3A    Fig-3B    Fig-3C
Fig-3D    Fig-3E    Fig-3F

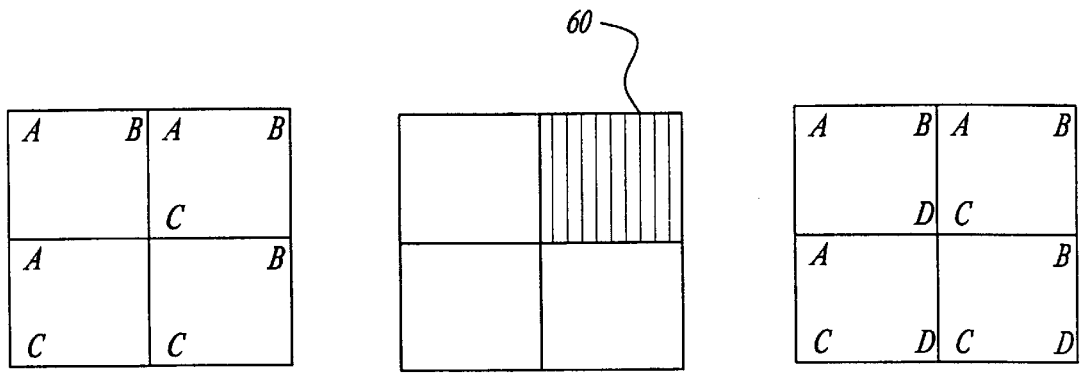
*Fig-3G*     *Fig-3H*     *Fig-3I*
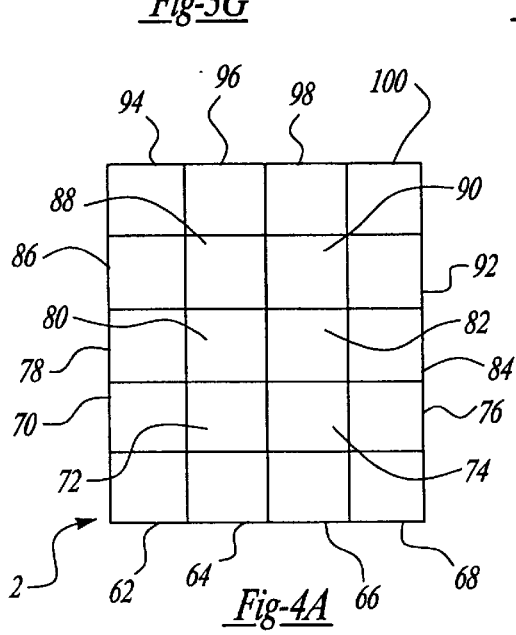
*Fig-4A*
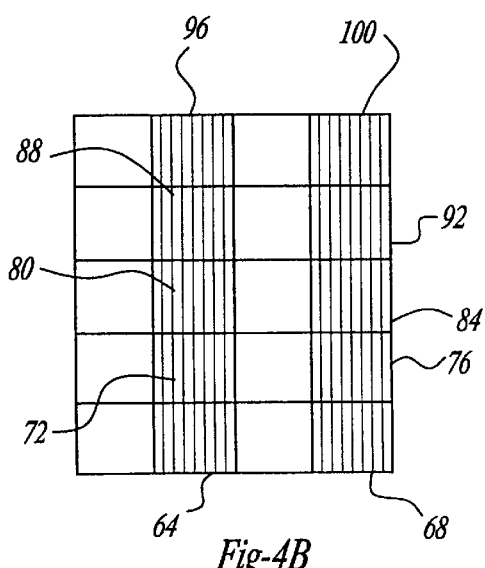
*Fig-4B*
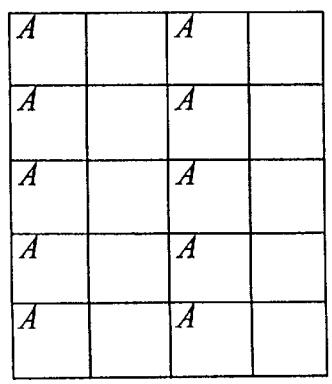
*Fig-4C*
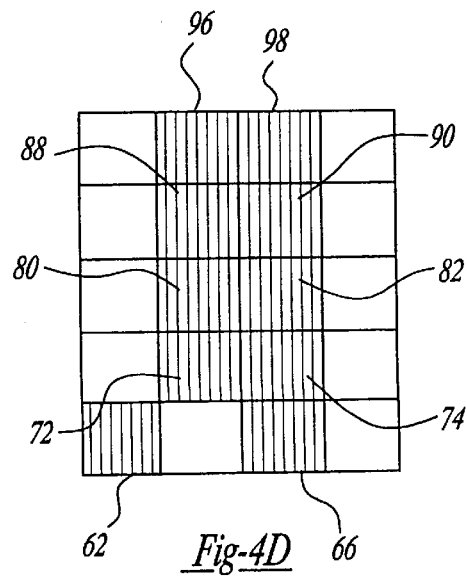
*Fig-4D*

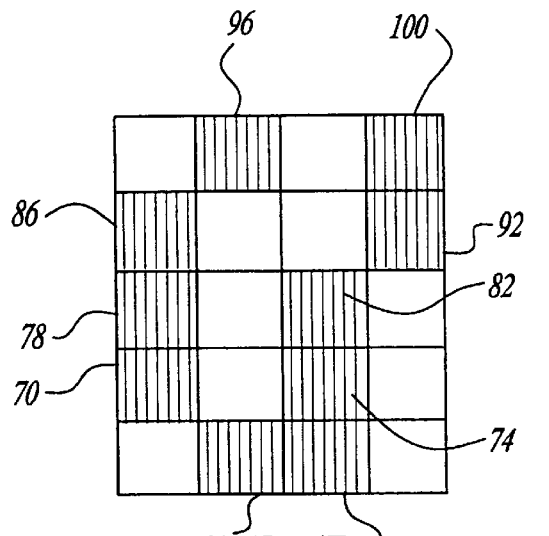
*Fig-4E*
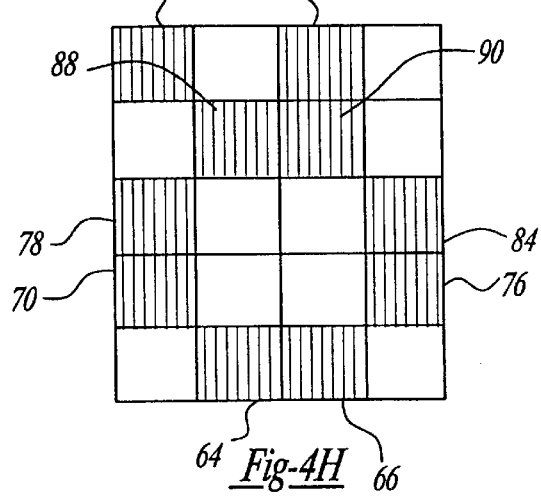
*Fig-4F*
*Fig-4G*
*Fig-4H*
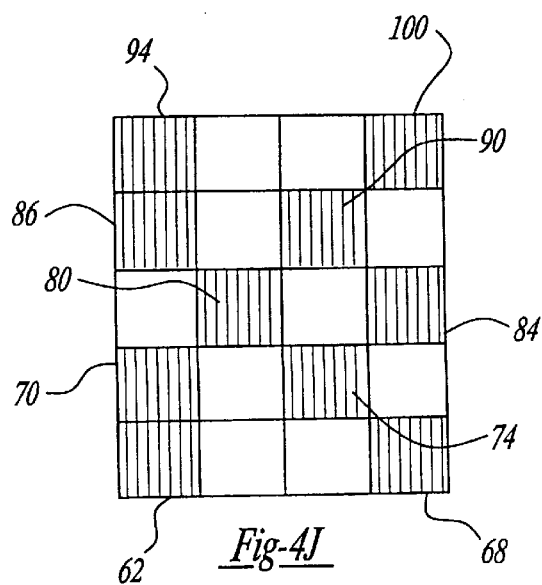
*Fig-4I*
*Fig-4J*

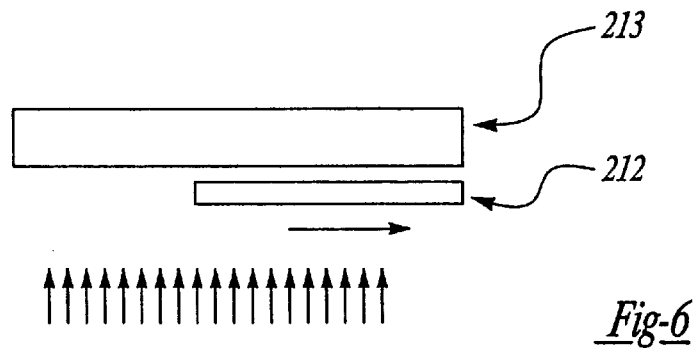
*Fig-6*
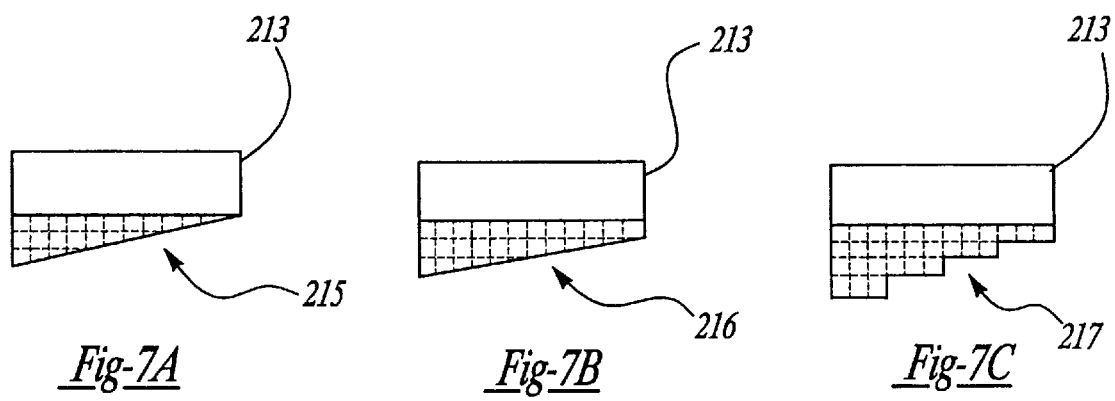
*Fig-7A*   *Fig-7B*   *Fig-7C*
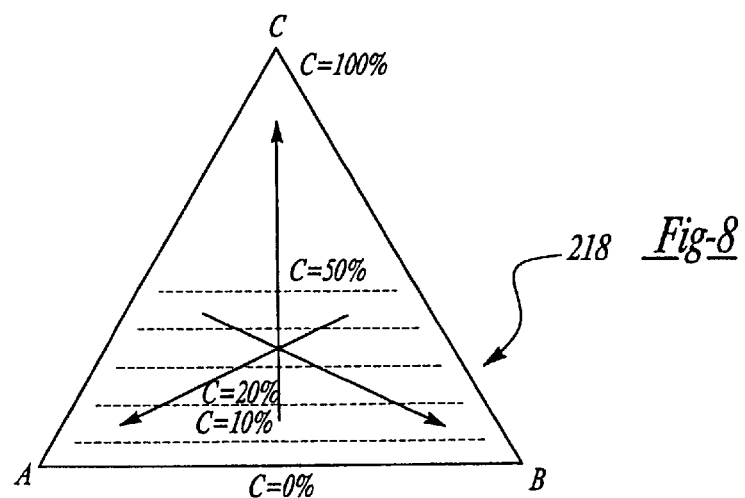
*Fig-8*

SYSTEMS AND METHODS FOR THE COMBINATORIAL SYNTHESIS OF NOVEL MATERIALS

CROSS REFERENCE TO RELATED APPLICATIONS

This application is a continuation-in-part of commonly assigned, U.S. patent applications Ser. Nos. 08/327,513, now U.S. Pat. No. 5,985,356 filed Oct. 18, 1994 (Attorney Docket No. 14939-000400) and of 08/438,043, now U.S. Pat. No. 5,776,359 filed May 8, 1995 (Attorney Docket No. 14939-000410) the complete disclosures of which are incorporated herein by reference for all purposes. This application is also related to commonly assigned, co-pending U.S. patent application Ser. No. 08/847,967 pending entitled "THE COMBINATORIAL SYNTHESIS OF NOVEL MATERIALS", concurrently filed with this application on Apr. 22, 1997 (Attorney Docket No. 16703-000700), the complete disclosure of which is incorporated herein by reference for all purposes.

STATEMENT OF GOVERNMENT INTEREST

This invention was made with Government support pursuant to Contract No. DE-AC03-76SF00098 awarded by the Department of Energy. The Government has certain rights in this invention.

FIELD OF THE INVENTION

The present invention generally relates to methods and apparatus for the parallel deposition, synthesis and screening of an array of diverse materials at known locations on a single substrate surface. The invention can be applied, for example, to prepare covalent network solids, ionic solids and molecular solids. More specifically, the invention is directed to physical masking systems and methods for applying films of materials to a substrate with deposition techniques, such as sputtering, laser deposition, ion beam, electron beam and thermal evaporation, spray coating and the like.

BACKGROUND OF THE INVENTION

The discovery of new materials with novel chemical and physical properties often leads to the development of new and useful technologies. Currently, there is a tremendous amount of activity in the discovery and optimization of materials, such as superconductors, zeolites, magnetic materials, phosphors, nonlinear optical materials, thermoelectric materials, high and low dielectric materials and the like. Unfortunately, even though the chemistry of extended solids has been extensively explored, few general principles have emerged that allow one to predict with certainty the composition, structure and reaction pathways for the synthesis of such solid state compounds.

The preparation of new materials with novel chemical and physical properties is at best happenstance with our current level of understanding. Consequently, the discovery of new materials depends largely on the ability to synthesize and analyze new compounds. Given approximately 100 elements in the periodic table which can be used to make compositions consisting of three, four, five, six or more elements, the universe of possible new compounds remains largely unexplored. As such, there exists a need in the art for a more efficient, economical and systematic approach for the synthesis of novel materials and for the screening of such materials for useful properties.

One of the processes whereby nature produces molecules having novel functions involves the generation of large collections (libraries) of molecules and the systematic screening of those collections for molecules having a desired property. An example of such a process is the humoral immune system which in a matter of weeks sorts through some $10^{12}$ antibody molecules to find one which specifically binds a foreign pathogen (Nisonoff, et al., *The Antibody Molecule* (Academic Press, New York, 1975)). This notion of generating and screening large libraries of molecules has recently been applied to the drug discovery process. The discovery of new drugs can be likened to the process of finding a key which fits a lock of unknown structure. One solution to the problem is to simply produce and test a large number of different keys in the hope that one will fit the lock.

Using this logic, methods have been developed for the synthesis and screening of large libraries (up to $10^{14}$ molecules) of peptides, oligonucleotides and other small molecules. Geysen, et al., for example, have developed a method wherein peptide syntheses are carried out in parallel on several rods or pins (see, *J. Immun. Meth.* 102:259–274 (1987), incorporated herein by reference for all purposes). Generally, the Geysen, et al. method involves functionalizing the termini of polymeric rods and sequentially immersing the termini in solutions of individual amino acids. In addition to the Geysen, et al. method, techniques have recently been introduced for synthesizing large arrays of different peptides and other polymers on solid surfaces. Pirrung, et al., have developed a technique for generating arrays of peptides and other molecules using, for example, light-directed, spatially-addressable synthesis techniques (see, U.S. Pat. No. 5,143,854 and PCT Publication No. WO 90/15070, incorporated herein by reference for all purposes). In addition, Fodor, et al. have developed, among other things, a method of gathering fluorescence intensity data, various photosensitive protecting groups, masking techniques, and automated techniques for performing light-directed, spatially-addressable synthesis techniques (see, Fodor, et al., PCT Publication No. WO 92/10092, the teachings of which are incorporated herein by reference for all purposes).

Using these various methods, arrays containing thousands or millions of different elements can be formed (see, U.S. patent application Ser. No. 08/805,727, now U.S. Pat. No. 5,941,728 filed Dec. 6, 1991, the complete disclosure of which is incorporated herein by reference for all purposes). As a result of their relationship to semiconductor fabrication techniques, these methods have come to be referred to as "Very Large Scale Immobilized Polymer Synthesis," or "VLSIPS™" technology. Such techniques have met with substantial success in, for example, screening various ligands such as peptides and oligonucleotides to determine their relative binding affinity to a receptor such as an antibody.

The solid phase synthesis techniques currently being used to prepare such libraries involve the stepwise, i.e., sequential, coupling of building blocks to form the compounds of interest. In the Pirrung, et al. method, for example, polypeptide arrays are synthesized on a substrate by attaching photoremovable groups to the surface of the substrate, exposing selected regions of the substrate to light to activate those regions, attaching an amino acid monomer with a photoremovable group to the activated region, and repeating the steps of activation and attachment until polypeptides of the desired length and sequences are synthesized. These solid phase synthesis techniques, which involve the sequential coupling of building blocks (e.g., amino acids) to form the compounds of interest, cannot readily be used to prepare many inorganic and organic compounds.

Schultz, et al. apply combinatorial chemistry techniques to the field of material science (PCT WO 96/11878, the complete disclosure of which is incorporated herein by reference). More particularly, Schultz, et al. provide methods and apparatus for the preparation and use of a substrate having an array of diverse materials in predefined regions thereon. A substrate having an array of diverse materials thereon is generally prepared by delivering components of materials to predefined regions on the substrate to form different materials. Using the methodology of Schultz, et al., many classes of materials can be generated combinatorially including, for example, inorganic materials, intermetallic materials, metal alloys, ceramic materials, etc. Once prepared, such materials can be screened for useful properties including, for example, electrical, thermal, mechanical, etc.

Developing new materials often requires combinatorial deposition of thin-films onto substrates wherein the precise chemical composition, concentrations, stoichiometries and thickness' of the deposited films is known. To this end, it would be beneficial to construct apparatus and methodology to produce arrays of materials with slightly varying composition, concentrations, stoichiometries and thickness' on known locations on a substrate so that the materials can be readily synthesized and analyzed.

SUMMARY OF THE INVENTION

The present invention provides methods and apparatus for the preparation of a substrate having an array of diverse materials in predefined regions thereon. A substrate having an array of diverse materials is prepared by depositing components of target materials onto predefined regions on the substrate to form at least two resulting materials. In particular, the present invention provides physical masking systems and methods for applying components onto a substrate in a combinatorial fashion, thus creating arrays of resulting materials that differ slightly in composition, stoichiometry, and/or thickness. Moreover, using the novel masking systems of the present invention, components of target materials can be delivered to each site in a uniform distribution, or in a gradient of stoichiometries, thicknesses, compositions, etc. Resulting materials which can be prepared using the methods and apparatus of the present invention include, for example, covalent network solids, ionic solids and molecular solids. Once prepared, these resulting materials can be screened in parallel for useful properties including, for example, electrical, thermal, mechanical, morphological, optical, magnetic, chemical and other properties.

In one embodiment of the present invention, a system for depositing diverse components of target materials onto substrates comprises a housing defining a processing area, a pedestal or susceptor with a substrate support surface in the processing area and at least two target materials. A delivery system is provided for depositing at least two components from the target materials at predefined regions of a substrate on the support surface of the pedestal. A physical mask system is located within the processing chamber between the delivery system and the substrate. The physical mask system includes one or more masks each having a pattern of openings for delivering the components through the openings to predefined regions on the substrate. According to the present invention, the physical mask and delivery systems are configured to apply the components onto the substrate in patterns that allow the relative performances of the resulting materials to be screened. Typically, each of the resulting materials will be screened or interrogated for the same function or property, and the relative performances of each resulting material with regard to that function or property will be determined. Thus, for example, the resulting materials may be screened for useful properties and then ranked or otherwise compared relative to each other with respect to these useful properties.

One advantage of the present invention is that the physical mask system provides precise control over the location and amount of each component deposited onto the selected regions of the substrate. This enables arrays of components with slightly varying composition, concentrations, stoichiometries and thickness' to be deposited onto known locations on the substrate so that the resulting materials can be readily synthesized and analyzed. In addition, the present invention has the ability to create tens, hundreds or thousands of different masking patterns in front of a substrate. This facilitates the building of combinatorial libraries containing more than 10 different resulting materials onto the substrate, more than 50 different resulting materials, preferably more than 100 resulting different materials, more preferably more than $10^3$ different resulting materials and often more than $10^6$ different resulting materials onto a single substrate, with each resulting material comprising a known combination of different components. Since the resulting materials are deposited at known locations on the substrate, they can be readily screened and compared with each other for performance and/or useful properties.

In a specific configuration, one of the physical mask system or the substrate support surface is movable relative to the other such that the physical mask system forms at least two patterns of openings for delivering at least two patterns of components onto the substrate. In some of the embodiments of the present invention, the physical mask system includes one or more shutter masks coupled to actuators or drives for translating, reciprocating and/or rotating the shutter masks relative to the substrate. In other embodiments, the susceptor or pedestal is movable so that the substrate may be rotated and/or translated relative to stationary or movable physical masks.

In one configuration, the physical mask system includes two pairs of opposing shutter masks on different levels from each other, and forming a rectangular configuration therebetween. At least two of the shutter masks and preferably all four are coupled to actuators or drives, e.g., step-motors, for reciprocating the shutter masks towards and away from each other. Using this shutter-mask system, a particular geometric shape, such as a rectangle or square of resulting material, can be precisely deposited onto the substrate by moving the opposing pairs of shutters. Rows and columns of components can also be deposited on a substrate by moving one set of opposite shutters while holding the other set stationary. In one embodiment, the shutter masks are mounted to a frame that can be rotated by a suitable drive for creating particular geometric shapes, such as triangles, circles and the like. In another embodiment, the susceptor or pedestal is coupled to a drive for rotating the susceptor and substrate relative to the shutter masks. In a particularly preferred embodiment, a three-element phase diagram may be generated on the substrate by simultaneously or sequentially depositing three components while moving the shutter masks and the susceptor to form the triangular phase diagram.

In another configuration, the physical mask system includes one or more shutter masks that can be translated at a constant or variable speed across the substrate to provide composition, thickness or stoichiometry gradients on the substrate. Typically, each shutter mask will be coupled to a suitable actuator drive, such as a solenoid, pneumatic drive or the like, and a control system for accurately controlling the speed and location of the shutter mask. In this embodiment, the system may also include other stationary masks or open masks for providing step gradients and other thin film geometries on the substrate.

In the delivery systems of the present invention, thin-film deposition techniques are preferably used in combination with the aforementioned masking systems to deposit thin-films of the various components on predefined regions of the substrate. Such thin-film deposition techniques may include sputtering techniques, spraying techniques, laser deposition techniques, electron beam or thermal evaporation techniques, ion beam, ion implantation or doping techniques, chemical vapor deposition (CVD) techniques, as well as other techniques used in the fabrication of integrated circuit devices. The components can be delivered as amorphous films, epitaxial films, or lattice and superlattice structures. Alternatively, the various components can be deposited into the reaction regions of interest from a dispenser in the form of droplets or powder. Suitable dispensers include, for example, micropipettes, mechanisms adapted from ink-jet printing technology and electrophoretic pumps.

In an exemplary configuration, a multi-target sputtering system comprises an enclosure assembly housing a processing chamber, a susceptor or pedestal having a substrate support surface and a sputter source, such as an RF magnetron sputter gun. In this embodiment, a single sputter source or gun, with in-situ target change capabilities, is used rather than a typical multi-sputter source. Sputtering is generally achieved by applying an electric field in the presence of a magnetic field to a target material that is held under vacuum in the presence of a process gas, such as, argon, oxygen, nitrogen, etc. The sputtering system further includes a substrate chamber for transferring substrates to and from the processing chamber and a target chamber coupled to the enclosure assembly for loading/unloading targets into and out of the processing chamber. In the preferred embodiment, each target contains a single target material or compound to minimize substrate contamination and to provide increased control of the sputtering process.

According to the present invention, the sputtering system includes one of the aforementioned shutter mask systems for creating arrays of resulting materials that differ slightly in composition, stoichiometry, and/or thickness. Each resulting material is deposited at predefined regions on the substrate by moving the shutter mask such that they create an opening over the preselected regions. The process is optionally repeated, with additional components, to form a vast array of components at predefined, i.e., known, locations on the substrate. The combination of components on a substrate form at least two resulting materials. The components can be sequentially or simultaneously delivered to predefined regions on the substrate in any stoichiometry, including a gradient of stoichiometries.

Once the components of interest have been delivered to predefined regions on the substrate, they can be reacted using a number of different synthetic routes to form an array of resulting materials. The components can be reacted using, for example, solution based synthesis techniques, photochemical techniques, polymerization techniques, template directed synthesis techniques, epitaxial growth techniques, by the sol-gel process, by thermal, infrared or microwave heating, by calcination, sintering or annealing, by hydrothermal methods, by flux methods, by crystallization through vaporization of solvent, etc. Additionally, components can react with each other instantly, upon contacting with each other, or in the air before contacting the substrate. The components may also form layers, blends or mixtures, in the air or on the substrate, rather than reacting with each other. Thereafter, the array can be screened for resulting materials having useful properties.

A further understanding of the nature and advantages of the inventions herein may be realized by reference to the remaining portions of the specification and the attached drawings.

BRIEF DESCRIPTION OF THE DRAWINGS

FIGS. 2A–2I illustrate the use of binary masking techniques to generate an array of materials on a single substrate;

FIGS. 3A–3I illustrate the use of physical masking techniques to generate an array of materials on a single substrate;

FIGS. 4A–4M illustrate the use of physical masking techniques to generate an array of materials on a single substrate;

FIG. 6 illustrates a method of generating a thickness or composite gradient using a single or multiple shutter masks according to the present invention;

FIGS. 7A–7C illustrate various film geometries that may be generated according to the methods of the present invention;

FIG. 8 illustrates a three-element phase diagram formed with the shutter mask system of FIG. 5;

FIG. 10A illustrates an example of an X/Y shutter mask; FIG. 10B illustrates 5 masking patterns which can be used to create 5 separate columns along a substrate for 5 different components; FIG. 10C illustrates an example of how the X/Y shutter mask can be used to create a thickness gradient of one component across the substrate; and FIG. 10D a mask which when translated across the substrate, 5 different components are deposited in each half of the substrate;

DETAILED DESCRIPTION OF THE INVENTION AND PREFERRED EMBODIMENTS CONTENTS

Figure 1:
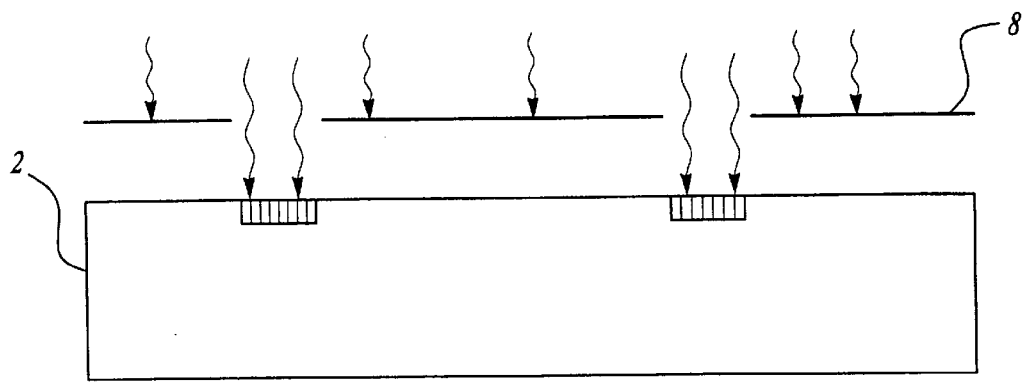
FIG. 1 illustrates masking of a substrate at a first location; the substrate is shown in cross-section.

I. Glossary
II. General Overview
III. Masking Systems and Methods for Thin Film Deposition
IV. Multi-Target Thin Film Deposition Systems and Methods
   A. Multi-Target Sputtering Systems
   B. Multi-Target Laser Deposition Systems
   C. Electron Beam and Thermal Evaporation Systems
   D. Spray Coating System
   E. Ion Beam Deposition System
V. Delivery Using A Dispenser
VI. Delivery Through Gas Manifolds
VII. Isolation of Reaction Regions on a Substrate
VIII. Methods For Screening the Array of Materials Glossary The following terms are intended to have the following general meanings as they are used herein.

1. Substrate: A material having a rigid or semi-rigid surface. In many embodiments, at least one surface of the substrate will be substantially flat, although in some embodiments it may be desirable to physically separate synthesis regions for different materials with, for example, dimples, wells, raised regions, etched trenches, or the like. In some embodiments, the substrate itself contains wells, raised regions, etched trenches, etc. which form all or part of the synthesis regions. According to other embodiments, small beads or pellets may be provided on the surface within dimples or on other regions of the surface or, alternatively, the small beads or pellets may themselves be the substrate.

The substrate will typically have a surface area of about 1 to 400 $cm^2$, usually about 6 to 100 $cm^2$. However, it should be understood that the substrate may be substantially smaller or larger than these ranges depending on the particular application. For example, the substrate may have a surface area as small as about 0.1 to 1 $cm^2$, or as large as about 1 to 100 $m^2$.

2. Predefined Region: A predefined region is a localized area on a substrate which is, was, or is intended to be used for formation of a selected resulting material and is otherwise referred to herein in the alternative as "known" region, "reaction" region, a "selected" region, or simply a "region." The predefined region may have any convenient shape, e.g., linear, circular, rectangular, elliptical, wedge-shaped, etc. Additionally, the predefined region, i.e., the reaction site, can be a bead or pellet which is coated with component(s) of interest. In this embodiment, the bead or pellet can be identified with a tag, such as an etched binary bar code that can be used to indicate the history of the bead or pellet, i.e., to identify which components were deposited thereon. In some embodiments, a predefined region and, therefore, the area upon which each distinct material is synthesized is smaller than about 25 $cm^2$, preferably less than 10 $cm^2$, more preferably less than 5 $cm^2$, even more preferably less than 1 $cm^2$, still more preferably less than 1 $mm^2$, and even more preferably less than 0.5 $mm^2$. In most preferred embodiments, the regions have an area less than about 10,000 $\mu m^2$, preferably less than 1,000 $\mu m^2$, more preferably less than 100 $\mu m^2$, and even more preferably less than 10 $\mu m^2$.

3. Radiation: Energy which may be selectively applied including energy having a wavelength between $10^{-14}$ and $10^4$ meters including, for example, electron beam radiation, gamma radiation, x-ray radiation, ultraviolet radiation, visible light, infrared radiation, microwave radiation and radio waves. "Irradiation" refers to the application of radiation to a surface.

4. Component: "Component" is used herein to refer to each of the individual chemical substances that are deposited onto a substrate. Components can act upon one another to produce a particular material. Components can react with each other, or can be acted upon by a third material, chemical substance, or energy source such as radiation, voltage, electric field, etc. A component can be an element, a chemical, a material, a mixture of elements or chemicals, etc in variable stoichiometries. Components may react directly with each other or with an external source, or, alternatively, they can form layers, blends or mixtures, or combinations thereof.

5. Target Material: The term "target material" is used herein to refer to material that can be composed of elements, compounds, chemicals, molecules, etc, that is vaporized, evaporated, boiled, sublimed, ablated, etc., from the surface of a container or holder (referred to as a "target") so that it can condense onto a substrate during the synthesis process. Generally, a "component" is used to refer to the individual chemical substances that are expelled from the target material to be deposited onto the substrate. The component can have the same composition as the target material, or it can comprise a portion, e.g., chemical, element or material, of the target material.

6. Resulting Material: The term "resulting material" is used herein to refer to the component or combination of components that have been deposited onto a predefined region of a substrate. The resulting materials may comprise a single component, or a combination or components that have reacted directly with each other or with an external source. Alternatively, the resulting material may comprises a layer, blend or mixture of components on a predefined region of the substrate. The resulting materials are screened for performance related to a specific function or useful property, and then compared with each other to determine their relative performance with respect to the specific function or useful property.

7. Mixture or Blend: The term "mixture" or, interchangeably, "blend" refers to a collection of molecules, ions, electrons, chemical substances, etc. Each component in the mixture can be independently varied. A mixture can consist of two or more substances intermingled with no constant percentage composition, wherein each component may or may not retain its essential original properties, and where molecular phase mixing may or may not occur. In mixtures, the components making up the mixture may or may not remain distinguishable from each other by virtue of their chemical structure.

8. Layer: The term "layer" is used herein to refer to a material that separates one material, component, substrate or environment from another. A layer is often thin in relation to its area and covers a material beneath it. A layer may or may not be thin or flat, but once it is deposited it generally covers the entire surface such that it separates the component or substrate below the layer from the component or atmosphere above the layer. A layer may be a flat, thin section of material which can have similar flat sections above and below it. The layers are thin in relation to their area and may cover all or part of the material beneath them.

II. General Overview

The present invention provides methods and apparatus for depositing various components onto substrates to generate a diverse array of resulting materials in predefined regions on the substrate. In particular, the present invention provides physical masking systems and methods for applying components onto a substrate in a combinatorial fashion, thus creating arrays of resulting materials that differ slightly in composition, stoichiometry, and/or thickness. Resulting materials which can be prepared in accordance with the methods of the present invention include, for example, covalent network solids, ionic solids and molecular solids. More particularly, resulting materials which can be prepared in accordance with the methods of the present invention include, but are not limited to, inorganic materials, intermetallic materials, metal alloys, ceramic materials, organic materials, organometallic materials, non-biological organic polymers, composite materials (e.g., inorganic composites, organic composites, or combinations thereof), or other materials which will be apparent to those of skill in the art upon review of this disclosure.

The substrate having an array of resulting materials thereon will have a variety of uses. For example, once prepared, the substrate can be screened for resulting materials having useful properties, and/or the resulting materials can be ranked, or otherwise compared, for relatively performances with respect to useful properties or other characterizations. Accordingly, the array of resulting materials is preferably synthesized on a single substrate. By synthesizing the array of resulting materials on a single substrate, screening the array for resulting materials having useful properties is more easily carried out. Properties which can be screened for include, for example, electrical, thermal mechanical, morphological, optical, magnetic, chemical, etc. More particularly, properties which can be screened for include, for example, conductivity, super-conductivity, resistivity, thermal conductivity, anisotropy, hardness, crystallinity, optical transparency, magnetoresistance, permeability, frequency doubling, photoemission, coercivity, dielectric strength, or other useful properties which will be apparent to those of skill in the art upon review of this disclosure. Importantly, the synthesizing and screening of a diverse array of resulting materials enables new compositions with new physical properties to be identified. Any resulting material found to possess a useful property can be subsequently prepared on a large-scale. It will be apparent to those of skill in the art that once useful resulting materials have been identified using the methods of the present invention, a variety of different methods can be used to prepare such useful materials on a large or bulk scale with essentially the same structure and properties. A more complete description of representative arrays of materials and methods for screening the materials for useful properties can be found in patent application "THE COMBINATORIAL SYNTHESIS OF NOVEL MATERIALS", Publication No. WO 95/13278, filed Oct. 18, 1995 (Attorney Docket No. 14939-00040OPC), the complete disclosure of which has previously been incorporated herein by reference for all purposes.

Generally, physical masking systems may be employed with deposition techniques for applying components onto a substrate in a combinatorial fashion, thus creating arrays of resulting materials at known locations on the substrate. The arrays of resulting materials will usually differ slightly in composition, stoichiometry, and/or thickness across the substrate. In addition, using the novel masking systems of the present invention, components can be delivered to each site in a uniform distribution, or in a gradient of stoichiometries, thicknesses, compositions, etc. According to some of the embodiments of the present invention, one of the physical mask system or the substrate is movable relative to the other such that patterns of target materials may be generated on the substrate. In some embodiments, one or more shutter masks are coupled to actuators or drives for translating, reciprocating or rotating the shutter masks relative to the substrate. In other embodiments, the susceptor or pedestal is movable so that the substrate may be rotated or translated relative to stationary or movable physical masks. Moving the mask relative to the substrate provides precise control over the location and amount of each component deposited onto selected regions of the substrate.

Specifically, one system of the present invention comprises a housing defining a processing area with a pedestal or susceptor with a substrate support surface, and a delivery system for depositing one or more components onto a substrate on the support surface of the pedestal. A physical mask system includes one or more shutter masks coupled to actuators or drives that translate, reciprocate or rotate the shutter masks in directions substantially parallel to the substrate support surface. In one embodiment, this system includes one or more shutter masks that can be linearly translated across the substrate to provide composition, thickness or stoichiometry gradients on the substrate. In another embodiment, the physical masking system includes two pairs of opposing shutters located in different planes from each other. Each opposing pair of shutter masks are coupled to actuators or drives for reciprocating the shutter masks towards and away from each other. Using this shutter-mask system, a rectangle or square of componet(s) can be deposited onto a substrate by moving the opposing pairs of shutters. Rows and columns of components can be deposited on a substrate by moving one set of opposite shutters. The location of a particular geometric shape, for example a rectangle, can be controlled using a motor, such as a step-motor, to position the shutter masks.

Generally, films or layers of components can be deposited onto a substrate using a variety of delivery techniques in combination with the aforementioned masking techniques of the present invention. For example, thin-film deposition techniques in combination with physical masking can be used to deliver the various components to selected regions on the substrate. Thin film deposition, sputtering systems, spraying techniques, laser deposition techniques, electron beam or thermal evaporation, ion beam deposition, ion implantation or doping techniques, chemical vapor deposition (CVD), as well as other techniques used in the fabrication of integrated circuits and epitaxially grown materials can be applied to deposit highly uniform layers of the various components on selected regions on the substrate. Such thin-film deposition techniques are generally used in combination with masking techniques to ensure that the components are being delivered only to the predefined regions of interest on the substrate. These techniques can be used to apply thin-films of materials onto a substrate in a combinatorial fashion, thus creating arrays of resulting materials that differ slightly in composition, stoichiometry, and/or thickness.

In preferred embodiments of the present invention, selected deposition techniques are used to generate arrays of resulting materials on a substrate by applying successive rounds of deposition of components through different masks including movable shutter-masks. These deposition techniques include but are not limited to sputtering, electron-beam and thermal evaporation, laser deposition, ion beam deposition, and spray-coating, and can be described as follows: (1) Sputtering is a method used to deposit thin-films on a substrate, and involves the ejection of surface atoms from a target material by momentum transfer from bombarding ions to surface atoms. Sputtering or sputter-deposition is a term that encompasses a variety of processes such as: RF/DC glow discharge plasma sputtering, ion-beam sputtering, diode sputtering, reactive sputtering, etc. (2) Electron-beam and thermal evaporation is a method used to deposit thin-films on a substrate wherein a vapor is generated by boiling or subliming a target material, the vapor is then transported from the target to a substrate and is condensed as a solid film on the substrate surface. The source used to boil or sublime the target material can be one or more electron beams. (3) In laser deposition techniques, a laser, such as, excimer or YAG laser, having sufficient power to cause evaporation, is directed through a view port to a target material held under vacuum. The target material is vaporized, the vapor is transported from the target to a substrate, and the vapor is condensed to a solid, thin-film on the substrate surface. (4) In spray-coating, sprayers can be used to deposit thin-films, and include ultrasonic nozzle sprayers, air atomizing nozzle sprayers, and atomizing nozzle sprayers. In this technique, the target material (in solution) is deposited onto a masked substrate by spraying through a nozzle. (5) Ion beam deposition is a method used to deposit thin films on a substrate by irradiating a target surface with an ion beam such that surface atoms are physically knocked out of the target material. The ion beam is typically generated from an ion beam gun.

Alternatively, the various components can be deposited on the reaction regions of interest from a dispenser in the form of droplets or powder. Conventional micropipetting apparatuses can, for example, be adapted to dispense droplet volumes of 5 nanoliters or smaller from a capillary. Such droplets can fit within a region having a diameter of 300 $\mu$m or less when a mask is employed. The dispenser can also be of the type employed in conventional ink-jet printers. Such ink-jet dispenser systems include, for example, the pulse pressure type dispenser system, the bubble jet type dispenser system and the slit jet type dispenser system. These ink-jet dispenser systems are able to deliver droplet volumes as small as 5 picoliters. Moreover, such dispenser systems can be manual or, alternatively, they can be automated using, for example, robotics techniques.

In preferred embodiments of this invention, various arrays of distinct components can be synthesized on substrates using, for example, combinatorial techniques. Examples of these arrays include, but are not limited to:

Example 1) A first component is delivered to predefined regions of a substrate, then a second component is delivered to predefined regions of said substrate, and so on. The resulting array of materials on the substrate is in the form of discrete regions comprised of layers, blends, mixtures or combinations thereof.

Example 2) The array of Example 1) wherein the resulting materials were formed on the substrate immediately as the components contacted each other on the substrate.

Example 3) The array of Example 1) wherein after components were deposited on the substrate, a processing step caused the resulting materials to interact to form layers, blends, mixtures, or materials resulting from a reaction between components.

Example 4) Two or more components are delivered to predefined regions of a substrate using fast sequential or parallel delivery such that said components interact with each other before contacting the substrate. The resulting array of materials on the substrate are in the form of discrete regions each comprised of blends mixtures, layers, or materials resulting from a reaction between components.

Example 5) As previously described, a first component is delivered to predefined regions of a substrate, then a second component is delivered to predefined regions of said substrate, and so on. Then a processing step causes the components to react to form an array of resulting materials.

In the methods of the present invention, the components, after being delivered to predefined regions on the substrate, can be reacted using a number of different synthetic routes. For example, the components can be reacted using, for example, solution based synthesis techniques, photochemical techniques, polymerization techniques, template directed synthesis techniques, epitaxial growth techniques, by the sol-gel process, by thermal, infrared or microwave heating, by calcination, sintering or annealing, by hydrothermal methods, by flux methods, by crystallization through vaporization of solvent, electromagnetic radiation, etc. Other useful synthesis techniques that can be used to simultaneously react the components of interest will be readily apparent to those of skill in the art. Additionally, components can react with each other instantly, upon contacting with each other, or in the air before contacting the substrate. The components may also form layers, blends or mixtures, in the air or on the substrate, rather than reacting with each other. Thereafter, the array can be screened for materials having useful properties.

III. Masking Systems and Methods for Thin Film Deposition

FIGS. 1 and. 2 illustrate the use of physical masking techniques which can be used in conjunction with deposition techniques to generate arrays of resulting materials on a substrate according to the present invention. More particularly, FIG. 1 illustrates one embodiment of the invention disclosed herein in which a substrate 2 is shown in cross-section. The mask 8 can be any of a wide variety of different materials including, for example, polymers, plastics, resins, silicon, metals, inorganic glasses, etc. Other suitable mask materials will be readily apparent to those of skill in the art. The mask is brought into close proximity with, imaged on, or brought directly into contact with the substrate surface as shown in FIG. 1. "Openings" in the mask correspond to regions on the substrate where it is desired to deliver a component. The openings in the mask can take on a variety of different sizes and shapes. Typically, the openings are circular, rectangular or square. Alternatively, however, they can be linear such that the components are delivered in a linear fashion from one end of the substrate to the other. This "linear" arrangement facilitates screening or detection in certain instances, such as when thermoelectric materials are being discovered and optimized. Conventional binary masking techniques in which one-half of the mask is exposed at a given time are illustrated hereinbelow. It will be readily apparent to those of skill in the art, however, that masking techniques other than conventional binary masking techniques can be used in the methods of the present invention.

Figure 2A:
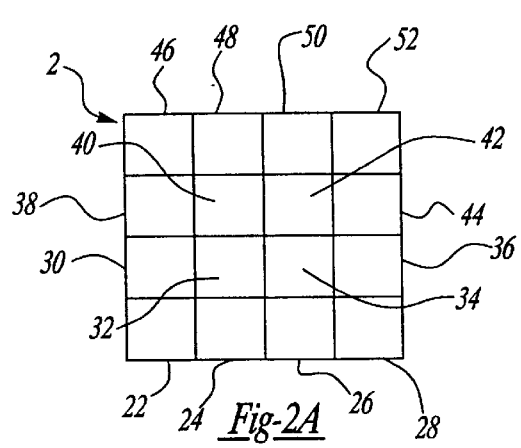
Figure 2B:
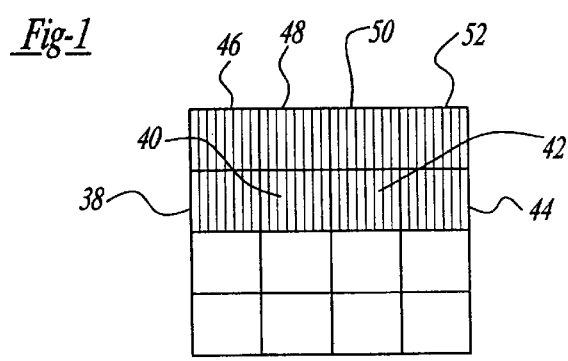
Figure 2C:
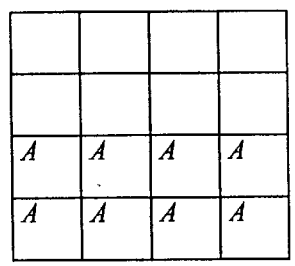
Figure 2D:
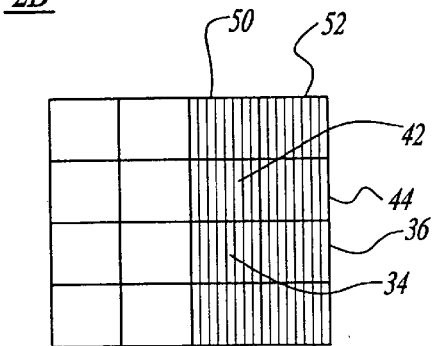
Figure 2E:
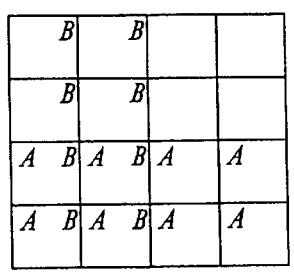

As shown in FIG. 2A, the substrate 2 is provided with regions 22, 24, 26, 28, 30, 32, 34, 36, 38, 40, 42, 44, 46, 48, 50 and 52. Regions 38, 40, 42, 44, 46, 48, 50 and 52 are masked, as shown in FIG. 2B, and component A is delivered to the exposed regions using, for example, spraying or sputtering techniques, with the resulting structure shown in FIG. 2C. Thereafter, the mask is repositioned so that regions 26, 28, 34, 36, 42, 44, 50 and 52 are masked, as shown in FIG. 2D, and component B is delivered to the exposed regions, with the resulting structure shown in FIG. 2E.

As an alternative to repositioning the first mask, a second mask can be used and, in fact, multiple masks are frequently required to generate the desired array of materials. If multiple masking steps are used, alignment of the masks may be performed using conventional alignment techniques in which alignment marks (not shown) are used to accurately overly successive masks with previous patterning steps, or more sophisticated techniques can be used. Moreover, it may be desirable to provide separation between exposed areas to account for alignment tolerances and to ensure separation of sites so as to prevent cross-contamination. In addition, it will be understood by those of skill in the art that the delivery techniques used to deliver the various components to the regions of interest can be varied from component to component, but, in most instances, it will be most practical to use the same or equivalent deposition techniques for each of the components.

Figure 2F:
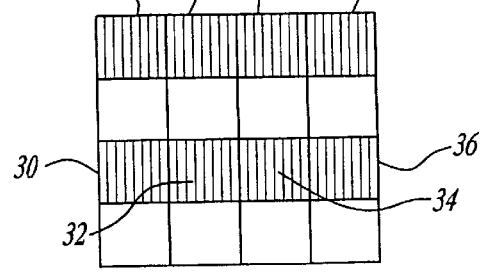

After component B has been delivered to the substrate, regions 30, 32, 34, 36, 46, 48, 50 and 52 are masked, as shown in FIG. 2F, using a mask different from that used in the delivery of components A and B. Component C is delivered to the exposed regions in the form of a thin-film, with the resulting structure shown in FIG. 2G. Thereafter, regions 24, 28, 32, 36, 40, 44, 48 and 52 are masked, as shown in FIG. 2H, and component D is delivered to the exposed regions in the form of a thin-film, with the resulting structure shown in FIG. 2I. Once the components of interest have been delivered to appropriate predefined regions on the substrate, they may be simultaneously reacted using any of a number of different techniques to form an array of at least two resulting materials.

As previously mentioned, masking techniques other than conventional binary masking techniques can be employed with deposition techniques in the methods of the present invention. For example, FIG. 3 illustrates a masking technique which can be employed to generate an array of resulting materials, each consisting of a combination of three different components, formed from a base group of four different components. In non-binary techniques, a separate mask is employed for each of the different components. Thus, in this example, four different masks are employed. As shown in FIG. 3A, the substrate 2 is provided with regions 54, 56, 58 and 60. Region 56 is masked, as shown in FIG. 3B, and component A is delivered to the exposed regions with the resulting structure shown in FIG. 3C. Thereafter, a second mask is employed to mask region 54, as shown in FIG. 3D, and component B is delivered to the exposed regions, with the resulting structure shown in FIG. 3E. Thereafter, region 58 is masked using a third mask, as shown in FIG. 3F, and component C is delivered to the exposed regions, with the resulting structure shown in FIG. 3G. Finally, a fourth mask is employed to mask region 60, as shown in FIG. 3H, and component D is delivered to the exposed regions, with the resulting structure shown in FIG. 3I. Once the components of interest have been delivered to appropriate predefined regions on the substrate, they may be simultaneously reacted using any of a number of different techniques to form an array of four different resulting materials.

Figures 4K, 4L, 4M:
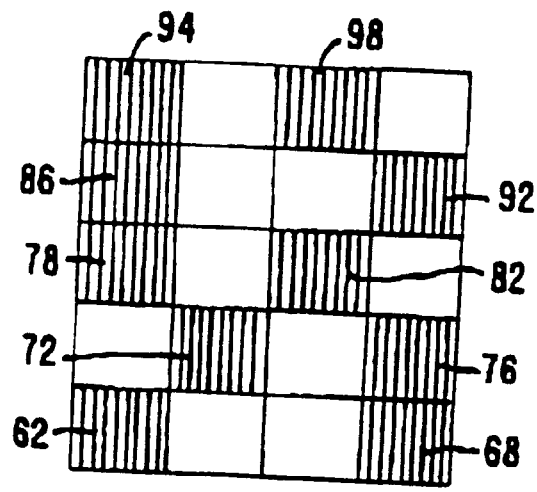

FIG. 4 illustrates another masking technique which can be employed to generate an array of resulting materials, each consisting of a combination of three different components, formed from a base group of six different components. As shown in FIG. 4A, the substrate 2 is provided with regions 62, 64, 66, 68, 70, 72, 74, 76, 78, 80, 82, 84, 86, 88, 90, 92, 94, 96, 98 and 100. Regions 64, 68, 72, 76, 80, 84, 88, 92, 96 and 100 are masked, as shown in FIG. 4B, and component A is delivered to the exposed regions, with the resulting structure shown in FIG. 4C. Thereafter, a second mask is employed to mask regions 62, 66, 72, 74, 80, 82, 88, 90, 96 and 98, as shown in FIG. 4D, and component B is delivered to the exposed regions, with the resulting structure shown in FIG. 4E. Thereafter, regions 64, 66, 70, 74, 78, 82, 86, 92, 96, and 100 are masked using a third mask, as shown in FIG. 4F, and component C is delivered to the exposed regions, with the resulting structure shown in FIG. 4G. Thereafter, a fourth mask is employed to mask regions 64, 66, 70, 76, 78, 84, 88, 90, 94 and 98, as shown in FIG. 4H, and component D is delivered to the exposed regions, with the resulting structure shown in FIG. 4I. Thereafter, regions 62, 68, 70, 74, 80, 84, 86, 90, 94 and 100 are masked with a fifth mask, as shown in FIG. 4J, and component E is delivered to the exposed region, with the resulting structure shown in FIG. 4K. Finally, a sixth mask is employed to mask regions 62, 68, 72, 76, 78, 82, 86, 92, 94 and 98, as shown in FIG. 4L, and component F is delivered to the exposed region, with the resulting structure shown in FIG. 4M. Once the components of interest have been delivered to appropriate predefined regions on the substrate, they may be simultaneously reacted using any of a number of different techniques to form an array of twenty (20) different resulting materials.

It will be readily apparent to those of skill in the art that, in some embodiments, prior to reacting the foregoing components, (by, for example, annealing) an additional component can be delivered to the predefined regions on the substrate in a gradient of stoichiometries. For example, once the six components have been delivered to appropriate predefined regions on the substrate, a seventh component can be delivered in a gradient fashion across the entire substrate or across portions of the substrate. The seventh component can, for example, be deposited through an appropriate mask from left to right as a gradient layer ranging from about 100 Å to 1,000 Å in thickness. Thereafter, the components can be simultaneously reacted, in some embodiments, using any of a number of different techniques (such as annealing) to form an array of different resulting materials.

In addition, it will be readily apparent to those of skill in the art that alternative masking techniques can be employed to generate an array of resulting materials, each consisting of a combination of 3 or more components, formed from a base group of four or more components. A more complete description of these techniques is described in U.S. patent application Ser. No. 08/327,513, filed Oct. 18, 1994 (Attorney Docket No. 14939-000400), entitled "THE COMBINATORIAL SYNTHESIS OF NOVEL MATERIALS", the complete disclosure of which has previously been incorporated herein by reference for all purposes.

When libraries containing more than 1,000 resulting materials are structured to only contain ternary, quaternary and quintenary materials, for example, the number of different masking steps involved can easily reach 30. Moreover, each library will likely require the use of some original masking patterns. Thus, it would be advantageous to have a system which has the ability to create tens, hundreds or thousands of different masking patterns in front of a substrate, each within a few seconds. Such a system is illustrated in FIG. 9.

Figure 9:
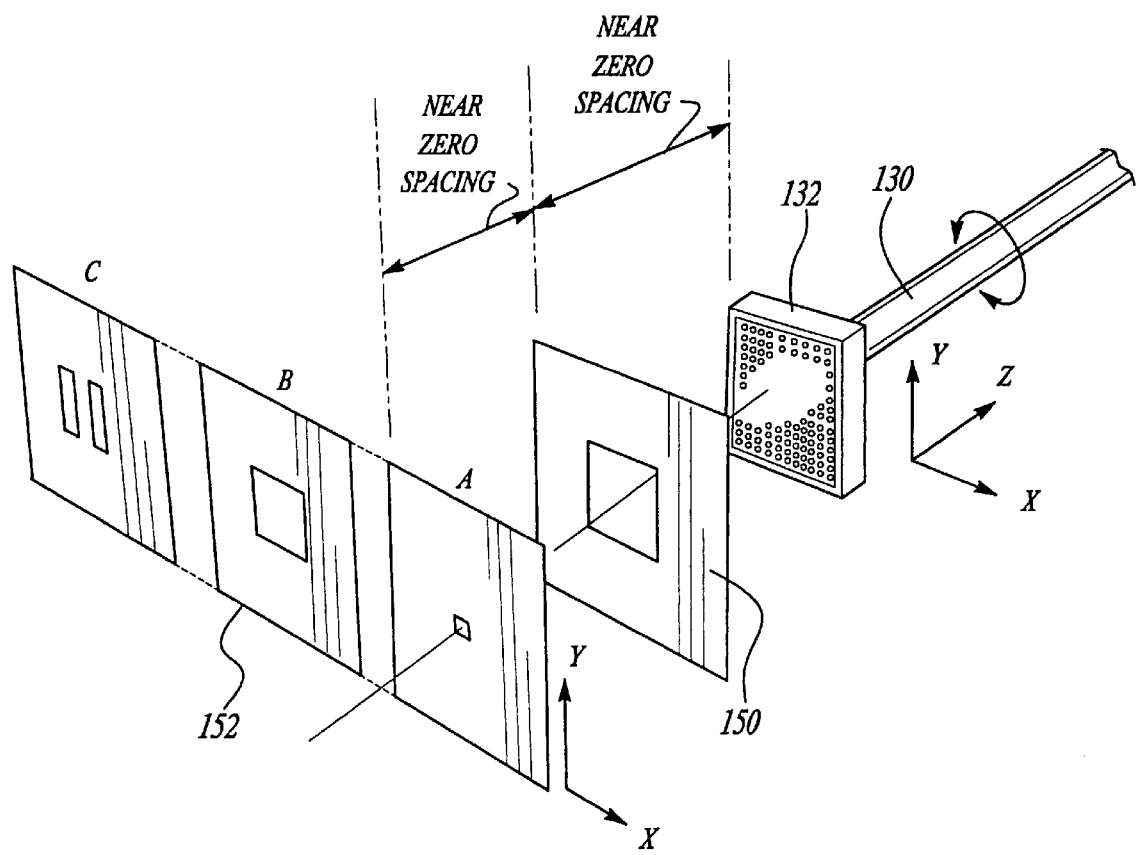
FIG. 9 illustrates another shutter masking system according to the present invention incorporating a movable substrate support surface.

In this design, the targets and laser can be configured as illustrated in FIG. 9. The substrate in a substrate holder 132 is attached to a shaft 130 which has translation capabilities in the X, Y and Z directions as well as rotational capabilities. The substrate is placed below a fixed plate with an aperture 150 which will preferably be greater than 1 cm$^2$, more preferably greater than 6 cm$^2$, and most preferably greater than 50 cm$^2$. Above the aperture plate 150 is a flat sheet 152 containing thereon multiple masks. This sheet 152 is attached to a manipulator or shaft 130 which can translate any mask directly over the aperture plate 150. Typically, there is little or no space between the aperture plate 150 and the sheet 152.

Figure 10A:
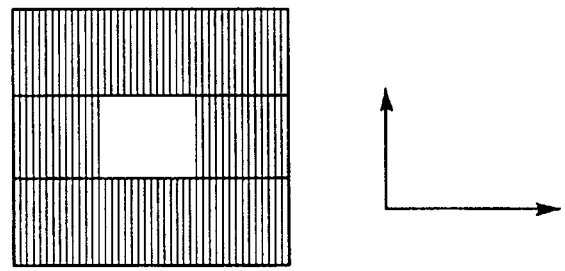
FIGS. 10A–10D illustrates various masks which can be used in carrying out the methods of the present invention.

One of the masks on the sheet 152 will consist in its most general form of nine squares, each of which is approximately of the same dimensions as the aperture in the aperture plate 150. Only the middle square is empty. This mask is shown in FIG. 10A. When attached to a flat sheet which can be translated in the X and Y directions, this mask effectively becomes an X/Y shutter mask. As such, it can create different size squares, rectangles, 'L' shapes and bars in either the X or Y directions. Given that the substrate can also translate in the X and Y directions, a two shutter mechanism is formed in this configuration. It can readily be seen by those skilled in the art that there are other arrangements (such as an 'L' shaped mask instead of a square mask) which can create a two shutter system that performs as the one described herein.

Figure 10B:
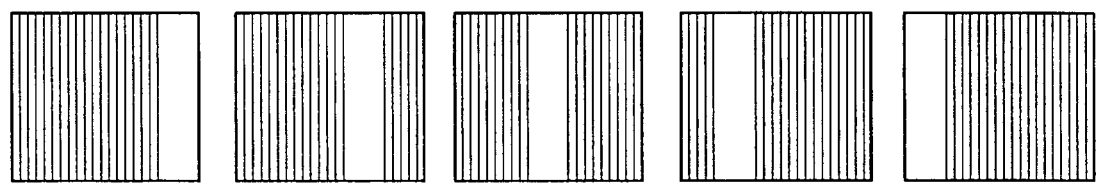
Figure 10C:
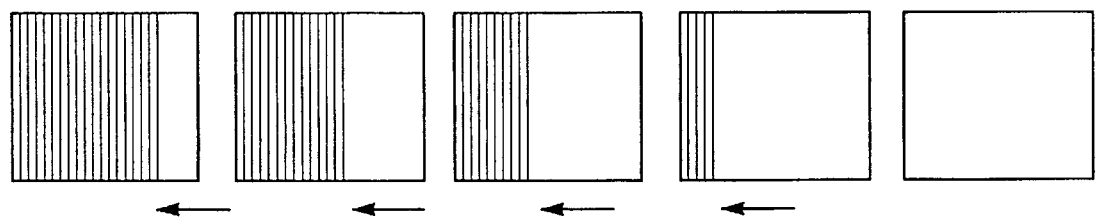

Using the X/Y shutter mask and substrate combination, hundreds of different masking configurations can be generated, each within a few seconds. For example, the 5 masking patterns set forth in FIG. 10B create 5 separate columns along a substrate for 5 different components. This identical design can be executed with the X/Y shutter mask by first sliding the mask to the right to form an opening ⅕ the size of the substrate, with the right side of the aperture plate (as shown in the first mask in FIG. 10B), and then moving the substrate to the left after every deposition. Thus, in the same number of deposition steps, i.e., 5, an identical pattern is created without the need to exchange masks. Moreover, when a thickness gradient of one component across the library is desired, the X/Y shutter can, for example, be translated at a constant speed from right to left as shown in FIG. 10C.

Figure 10D:
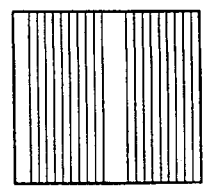
Figure 11:
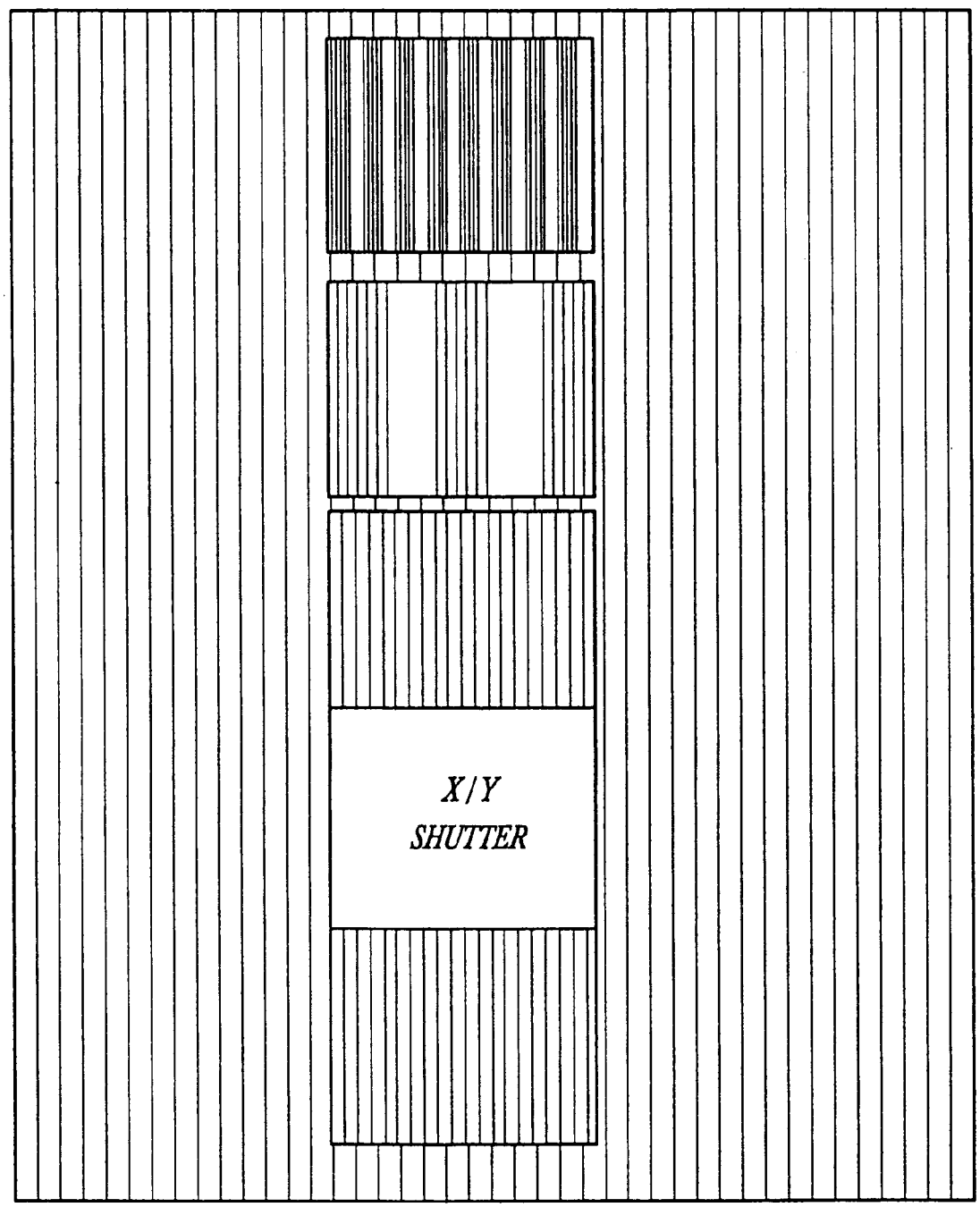
FIG. 11 illustrates an example of a flat sheet containing thereon both binary masks and an X/Y shutter.

The foregoing X/Y shutter system can advantageously be used in combination with more traditional binary masking techniques. For example, when the mask set forth in FIG. 10D is translated across the substrate, 5 different components are deposited in each half of the substrate. However, with the X/Y shutter system, twice the number of steps are needed. Therefore, it is frequently advantageous to incorporate binary masks in addition to the X/Y shutter on the flat sheet 152 which sits directly above the aperture plate 150. An example of such a sheet configuration is illustrated in FIG. 11. Notice that by rotating the substrate 90°, it is possible to apply the masking patterns in both the X and Y directions which reduces the number of necessary masks by half. If the sheet is fixed in one-dimension (e.g., the X direction), the substrate must be given a rotational degree of freedom so that it can be rotated 90°.

In addition to being used in combination with traditional binary masking techniques, the X/Y shutter system can be advantageously used in combination with other masking techniques. For example, the masking system may include a positioning system with x, y, z, and rotational movement capability, and a translation system comprised of masks contained on a strip of material that can be wound onto a roll such that the masks can be displayed in serial fashion by unwinding and winding said rolls. Alternatively, the X/Y shutter system can be used with the previously described method for generating masking strategies for experiments involving the use of distinct groups of reaction components, wherein the members of each group are related in such a way that it would not be desirable for them to interact with one another. The following sets forth an example of how this can be carried out.

In this example, there are three groups of components, i.e., group 8, group 5 and group 3, each of which contains 8, 5, and 3 elements, respectively. Moreover, group 8 has 5 settings per element, group 5 has 3 settings per element, and group 3 has 1 setting per element. As such, the number of sites on the array would be 1800 or (8×5)×(5×3)×(3×1). To prepare an array having 1800 sites, one could use a rectangular substrate having 40 rows running across the width of the substrate, and 45 columns running down the length of the substrate. Group 8, having 8 elements and 5 settings per element, would be deposited along the rows, whereas group 5, having 5 elements and 3 settings per element, and group 3, having 3 elements and 1 setting per element, would be deposited along the columns. Using the masking system described in FIG. 9 and assuming the deposition rate is about 5 Å/s for a 1"×1" area and the deposition thickness for each layer is 2 Å, the number of masking steps required would be 34 for a total deposition time of 23 minutes. This value does not take into account the transfer time needed to exchange the 34 masks. Using the X/Y shutter system described above, 90 steps would be required for a total deposition time of 1 hour. However, using two masks in combination with the X/Y shutter system, the number of masking steps required would be reduced to 50 and the deposition time would be reduced to 33 minutes.

Figure 5:
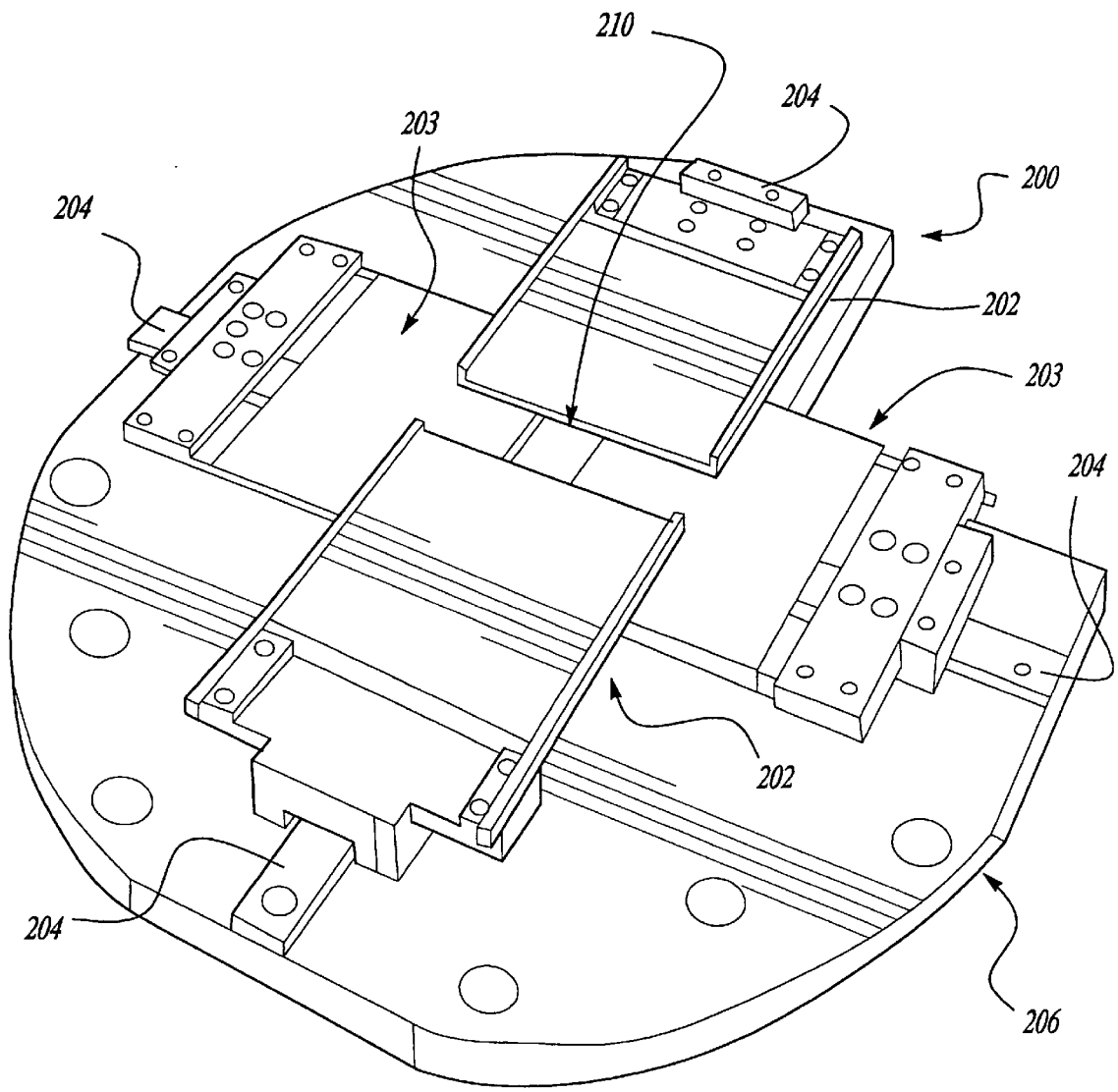
FIG. 5 is a perspective view of a shutter-mask system according to the present invention.

FIGS. 5–8 illustrate a specific embodiment of a movable shutter masking system 200 according to the present invention for applying diverse components at known locations onto a substrate. As shown in FIG. 5, shutter masking system 200 preferably includes two pairs of opposing shutter masks 202, 203 that form an "opening" 210 therebetween for depositing a component on a substrate (not shown). The opening formed by shutter masks 202, 203 can take on a variety of different sizes and shapes, e.g., circular, rectangular or square. In the preferred configuration, the shutter masks 202, 203 each have a rectangular or square shape so that the opening therebetween will be rectangular or square, with the particular size and shape depending on the relative positions of the masks. The shutter masks 202, 203 opposite to each other are on the same level, and the shutters that are adjacent to each other are on a different level so that the shutter masks 202, 203 can overlap each other. This allows various shapes to be formed on the substrate by moving the shutter masks 202, 203 as target materials are deposited thereon. As discussed below, two of the shutter masks 202, 203 move in the X—X direction and two of the shutters move in the Y—Y direction. The thickness of each shutter mask 202, 203 usually ranges from about 1 µm to 10 mm, preferably about 10 µm to 50 µm. The shutter masks 202, 203 can be any of a wide variety of different materials including, for example, polymers, plastics, resins, silicon, metals, inorganic glasses, etc. Other suitable mask materials will be readily apparent to those of skill in the art.

As shown, shutter masks 202, 203 are slidably coupled to mounting brackets 204, which are each mounted to a frame 206. Typically, frame 206 will be mounted in, or made integral with, an enclosure of a processing chamber (see FIGS. 12A and 12B). Shutter masks 202, 203 will preferably be located relatively close to the substrate to ensure that the components that pass through the opening 210 will deposit onto the region of the substrate underlying opening 210 (i.e., without dispersing outward from this region). Of course, the preferred distance between the shutter masks and the substrate will vary widely based on the type of deposition that is used. Usually, the distance between the lower surfaces of shutter masks 202, 203 and the substrate is about 0 to 1 cm, preferably about 1 micron meter to 200 micron meters, and more preferably about 5 to 20 micron meters. System 200 further includes at least two, and preferably four, actuators (not shown) coupled to the shutter masks 202, 203 for translating masks 202, 203 towards and away from each other, as shown by the arrows in FIG. 5. In the representative embodiment, all four shutter masks 202, 203 may be independently translated relative to each other. However, it will be recognized that a single actuator may be used, for example, to translate both opposing shutter masks so that only two separate actuators are required.

The actuators, e.g., solenoids, can be driven to reciprocate shutter masks 202, 203 by a variety of conventional or non-conventional drive mechanisms, such as electromagnetic systems, pneumatic systems, linear drive, stepper motors or the like. The drive mechanisms may be located either inside or outside of the vacuum chamber. Preferably, the actuators are driven by step motors. The shutter mask system of the present invention provides precise control over the location and amount of each component deposited onto selected regions of the substrate. In addition, the shutter masks allows many different (e.g., on the order of tens, hundreds or thousands) masking patterns to be rapidly changed during processing to enable arrays of resulting materials with slightly varying composition, concentrations, stoichiometries and thickness' to be deposited onto known locations on the substrate. To that end, the actuators and drive mechanism are preferably equipped with position feedback mechanisms (i.e., encoders) of the type used in devices for semiconductor device manufacturing and testing. Such mechanisms will preferably be closed loop systems with insignificant backlash and hysteresis.

In use with shutter-mask system 200, a rectangle or square of component(s) can be deposited onto a substrate by moving the X—X and Y—Y shutter masks 202, 203. Rows and columns of component(s) can also be deposited on a substrate by moving one set of opposite shutters. In the preferred embodiment, the substrate may also be translated relative to the frame 206 so that shutter masks 202, 203 may be positioned at selected regions on the substrate. Thus, the shutter masks 202, 203 are centered at a selected target region on the substrate. Then, shutter masks 202, 203 will be moved appropriately to form the desired shape on the substrate. The shutter-masks and/or the substrate can also be rotated in a circular fashion. The latter embodiment is discussed in detail below. However, it will be recognized that each shutter mask 202, 203 may be rotated individually, if desired. Using a shutter-mask system wherein the shutter-masks and/or the substrate rotates, various geometrical shapes (e.g., triangles, circles, diamonds, etc) of the deposited components can be formed on a substrate. Once the components of interest have been delivered to appropriate predefined regions on the substrate, they may, in some cases, be simultaneously reacted using any of a number of different techniques to form an array of many different resulting materials.

In another embodiment, depicted in FIG. 6, a shutter mask system 210 includes a single shutter mask 212 that can be translated and/or rotated in directions substantially parallel to the substrate 213. Shutter mask 212 can, for example, be used to make a thickness composition, or stoichiometry gradient across the substrate 213. Specifically, shutter mask 212 can be translated in a linear direction across a substrate 213, or a defined region of a substrate 213, to allow components to be deposited in a manner that enables the building of a gradient 215 that varies in thickness or composition across the substrate or defined region of the substrate (see FIG. 7A). Shutter mask system 210 may further include an open physical mask (not shown). In combination with the moving shutter mask 212, open physical mask can be employed to deposit components in the gradient 216 shown in FIG. 7B, or in a step gradient 217, as shown in FIG. 7C.

In a preferred embodiment, using the shutter mask system 200 of FIG. 5 combined with rotation of the substrate and/or shutter masks 202, 203, a library such as a 3-element phase diagram 218 can be constructed (see FIG. 8). As shown, a composition or thickness gradient of C can be formed along A-B, etc. For example, any composition of $A_xB_yC_z$ can be formed in the structure such that: $x=0-1$, $y=0-1$, $z=0-1$. Alternatively, a more complicated phase diagram system can be formed using, for example, $A_xB_yC_zO_3$, where Oxygen is fixed. This can be written in more general form, $A_xB_yC_zD_f$, where f=constant. In this system, a uniform D layer can be deposited across the substrate. An alternate system can be described by, for example, $(AE)_xB_yC_z$ such that any similar composition can be made by adjusting the A/E ratio. Note that A, B, C, D, and E can be single elements or compounds.

In another embodiment, components are delivered such that two or more materials can be delivered simultaneously with the ratio of each component being varied during delivery. In one example of this method, the power of two electron beam sources can be varied so that component A is delivered to the substrate in increasing or decreasing amounts while component B is either delivered in a constant amount or varied in the opposite direction of component A. In another example, two or more components are delivered using any of the delivery techniques described herein. In this embodiment, shutters are moved into and out of the path of the liquid or vapor components before they contact the substrate to control the amounts of each material that reach the substrate.

To deposit components consistently at precisely specified regions using a shutter mask system, a frame of reference common to the shutter mask(s) 202, 203 and the substrate may be desired. In other words, the reference coordinates of the shutter mask(s) 202, 203 should be accurately mapped onto the reference coordinates of the substrate. Ideally, only two reference points on the substrate are required to completely map the array of reaction regions. The shutter mask(s) locate these reference points and then adjust their internal reference coordinates to provide the necessary mapping. After this, the shutter mask(s) are moved a particular distance in a particular direction and positioned directly over a known region. Of course, the shutter mask(s) must provide precisely repeatable movements. Further, the individual regions of the array must not move with respect to the reference marks on the substrate after the reference marks have been formed.

To allow for this possibility, a substrate containing both "global" and "local" reference marks is preferably employed. In preferred embodiments, only two global reference marks are conveniently located on the substrate to define the initial frame of reference. When these points are located, the shutter mask(s) have an approximate map of the substrate and the predefined regions therein. To assist in locating the exact position of the regions, the substrate is further subdivided into local frames of reference. Thus, in an initial, "course" adjustment, the shutter mask(s) positioned within one of the local frames of reference. Once in the local region, the shutter mask(s) look for local reference marks to define further a local frame of reference. From these, the shutter mask(s) move exactly to a specified region where the component is to be deposited. In this manner, the effects of warpage or other deformation can be minimized. The number of local reference marks is determined by the amount of deformation expected in the substrate. If the substrate is sufficiently rigid so that little or no deformation will occur, very few local reference marks are required. If substantial deformation is expected, however, more local reference marks are required.

For purposes of this invention, the spacing between the individual regions will vary in accordance with the size of the regions used. For example, if a 1 mm$^2$ region is used, the spacing between the individual regions will preferably be on the order of 1 mm or less. If, for example, a 10 $\mu$m$^2$ region is used, the spacing between the individual regions will preferably be on the order of 10 $\mu$m or less. Further, the angular relation between the cells is preferably consistent, to within 0.1 degrees. Of course, the photolithographic or other process used to define the arrangement of cells will accurately define the angle and spacing. However, in subsequent processes (e.g., pressing processes), the angle can be distorted. Thus, in some embodiments, it may be necessary to employ "local" reference points throughout the array.

The foregoing is an example of the many different thin-film physical masking systems which can be used in carrying out the methods of the present invention. Such systems provide general strategies and designs for the systems used to generate combinatorial libraries of layered thin-film resulting materials. It will be readily apparent to those of skill in the art that the foregoing systems can be modified and optimized in minor ways to work with any of the different deposition techniques discussed below.

IV. Multi-Target Thin Film Deposition Systems and Methods

Thin-film deposition techniques in combination with the aforementioned physical masking techniques can be used to deposit components of target materials onto predefined regions on a substrate. Such deposition techniques can generally be broken down into the following four categories: evaporative methods, glow-discharge processes, gas-phase chemical processes, and liquid-phase chemical techniques. Included within these categories are, for example, sputtering techniques, spraying techniques, laser deposition techniques, electron beam or thermal evaporation techniques, ion beam deposition, ion implantation or doping techniques, chemical vapor deposition techniques, as well as other techniques used in the fabrication of integrated circuits. All of these techniques can be applied to deposit highly uniform layers, i.e., thin-films, of the various components on selected regions on the substrate. Moreover, by translating, reciprocated and rotating the masks, the delivery source and/or the substrate, such deposition techniques can be used to generate uniform gradients at each region on the substrate or, alternatively, over all of the regions on the substrate. For an overview of the various deposition techniques which can be used in the methods of the present invention, see, for example, *Handbook of Thin-Film Deposition Processes and Techniques,* Noyes Publication (1988), which is incorporated herein by reference for all purposes.

The various materials can be deposited on the substrate using evaporative methods in combination with physical masking techniques. Generally, in thermal evaporation or vacuum evaporation methods, the following sequential steps take place: (1) a vapor is generated by boiling or subliming a target material; (2) the vapor is transported from the source to a substrate; and (3) the vapor is condensed to a solid film on the substrate surface. Evaporants, i.e., target materials, which can be used in the evaporative methods cover an extraordinary range of chemical reactivities and vapor pressures and, thus, a wide variety of sources can be used to vaporize the target materials. Such sources include, for example, resistance-heated filaments, electron beams; crucible heated by conduction, radiation or rf-inductions; and arcs, exploding wires and lasers. In preferred embodiments of the present invention, thin-film deposition using evaporative methods is carried out using lasers, filaments, electron beams or ion beams as the source. In further preferred embodiments of the present invention, thin-film deposition using evaporative methods is carried out using lasers as the source. In such laser deposition techniques, an excimer or YAG laser, having sufficient power to cause evaporation, is directed through a viewport to a target material held under vacuum. The target material is vaporized, the vapor is transported from the source to a substrate, and the vapor is condensed to a solid, thin-film on the substrate surface. Successive rounds of deposition, through different physical and/or shutter masks, using the foregoing evaporative methods can be used to generate an array of materials on a substrate.

In addition to evaporative methods, the various materials can be deposited on the substrate using glow-discharge processes in combination with physical and/or shutter masking techniques. The most basic and well known of these processes is sputtering, i.e., the ejection of surface atoms from an electrode surface by momentum transfer from bombarding ions to surface atoms. Sputtering or sputter-deposition is a term used by those of skill in the art to cover a variety of processes, all of which can be used in the methods of the present invention. One such process is RF/DC Glow Discharge Plasma Sputtering. In this process, a plasma of energized ions is created by applying a high RF or DC voltage between a cathode and an anode. The energized ions from the plasma bombard the target and eject atoms which are then deposited on a substrate. Ion-Beam Sputtering is another example of a sputtering process which can be used to deposit thin-films of the various components on a substrate. Ion-Beam Sputtering is similar to the foregoing process except the ions are supplied by an ion source and not a plasma. It will be apparent to one of skill in the art that other sputtering techniques (e.g., diode sputtering, reactive sputtering, etc.) and other glow-discharge processes can be used in the methods of the present invention to deposit thin-films on a substrate. Successive rounds of deposition, in combination with moving shutter masks or a moving substrate, using sputtering or other glow-discharge techniques can be used to generate an array of components on a substrate for parallel synthesis.

In addition to evaporative methods and sputtering techniques, the various components can be deposited on a substrate using Chemical Vapor Deposition (CVD) techniques in combination with shutter masking techniques. CVD involves the formation of stable solids by decomposition of gaseous chemicals using heat, plasma, ultraviolet, or other energy source, or a combination of energy sources. Photo-Enhanced CVD, based on activation of the target materials in the gas or vapor phase by electromagnetic radiation, usually short-wave ultraviolet radiation, and Plasma-Assisted CVD, based on activation of the target materials in the gas or vapor phase using a plasma, are two particularly useful chemical vapor deposition techniques.

In addition to evaporative methods, sputtering and CVD, the various components of target materials can be deposited on a substrate using a number of different mechanical techniques in combination with physical masking techniques. Such mechanical techniques include, for example, spraying, spinning, dipping, draining, flow coating, roller coating, pressure-curtain coating, brushing, etc. Of these, the spray-on and spin-on techniques are particularly useful. Sprayers which can be used to deposit materials include, for example, ultrasonic nozzle sprayers, air atomizing nozzle sprayers and atomizing nozzle sprayers. In ultrasonic sprayers, disc-shaped ceramic piezoelectric transducers covert electrical energy into mechanical energy. The transducers receive electrical input in the form of a high-frequency signal from a power supply that acts as a combination oscillator/amplifier. In air atomizing sprayers, the nozzles intermix air and liquid streams to produce a completely atomized spray. In atomizing sprayers, the nozzles use the energy from a pressurized liquid to atomize the liquid and, in turn, produce a spray.

In addition to the foregoing techniques, photolithographic techniques of the type known in the semiconductor industry can be used. For an overview of such techniques, see, for example, *Sze, VLSI Technology,* McGraw-Hill (1983) and Mead, et al., *Introduction to VLSI Systems,* Addison-Wesley (1980), which are incorporated herein by reference for all purposes. A number of different photolithographic techniques known to those of skill in the art can be used. In one embodiment, for example, a photoresist is deposited on the substrate surface; the photoresist is selectively exposed, i.e., photolyzed; the photolyzed or exposed photoresist is removed; a component is deposited on the exposed region(s) on the substrate; and the remaining unphotolyzed photoresist is removed. Alternatively, when a negative photoresist is used, the photoresist is deposited on the substrate surface; the photoresist is selectively exposed, i.e., photolyzed; the unphotolyzed photoresist is removed; a component is deposited on the exposed region(s) on the substrate; and the remaining photoresist is removed. In another embodiment, a component is deposited on the substrate using, for example, spin-on or spin-coating techniques; a photoresist is deposited on top of the component; the photoresist is selectively exposed, i.e., photolyzed; the photoresist is removed from the exposed region(s); the exposed region(s) are etched to remove the component from that region(s); and the remaining unphotolyzed photoresist is removed. As with the previous embodiment, a negative photoresist can be used in place of the positive photoresist. Such photolithographic techniques can be repeated to produce an array of resulting materials on a substrate.

In addition to, or as an alternative to, the above techniques, other systems may be employed to control deposition of components onto a substrate. In one embodiment of the invention, deposition is controlled by selectively heating predefined regions of the substrate. The substrate may be heated, for example, in a linear gradient along the length of the substrate or selectively in any desired pattern. To that end, the deposition system will include a plurality of separate heating sources, such as resistive heating elements, or a plurality of different heating sources, such as IR radiation, thermally coupled to the predefined regions on the substrate. In one example, a substrate is heated in a linear gradient along its length from about 400 degrees Celsius to about 700 degrees Celsius. Component1(s) are then deposited in a linear pattern along the substrate using a shutter mask that provides a slit or other such opening to deposit the materials therethrough. The component(s) may be deposited with varying compositions, stoichiometries, thicknesses, etc. Alternatively, the same component1 with the same composition may be deposited through the slit onto regions of varying temperatures to determine which temperature is optimal for deposition to create a certain desired property of the resulting material. The substate may also be heated, for example, in a circular gradient from the center out to the edges.

It will be readily apparent to those of skill in the art that the foregoing deposition techniques are intended to illustrate, and not restrict, the ways in which the components can be deposited on the substrate. Other deposition techniques known to and used by those of skill in the art can also be used. In addition, it should be noted that, while the instant disclosure would appear to imply that two-dimensional arrays of resulting materials are formed on a substrate, the invention is not limited to this configuration. For example, the novel deposition and masking techniques described herein may be used to form three-dimensional arrays of resulting materials onto a substrate. In one embodiment, these three dimensional arrays will comprise layers of arrays, with each layer comprising different resulting materials than the adjacent layers. Each layer may have arrays of resulting materials with different patterns. For example, an XYZ three-dimensional array may include three different components that vary in one aspect, such as stoichiometry, with the concentration of each component changing along one direction. In another embodiment, the substrate may comprise, for example, a honeycomb structure that includes predefined regions in three dimensions, i.e., length, width and depth. Components may be deposited in layers into the honeycomb structure, or alternatively, into predefined regions at different depths along the honeycomb structure.

A. Multi-Target Sputtering Systems

Figure 12A:
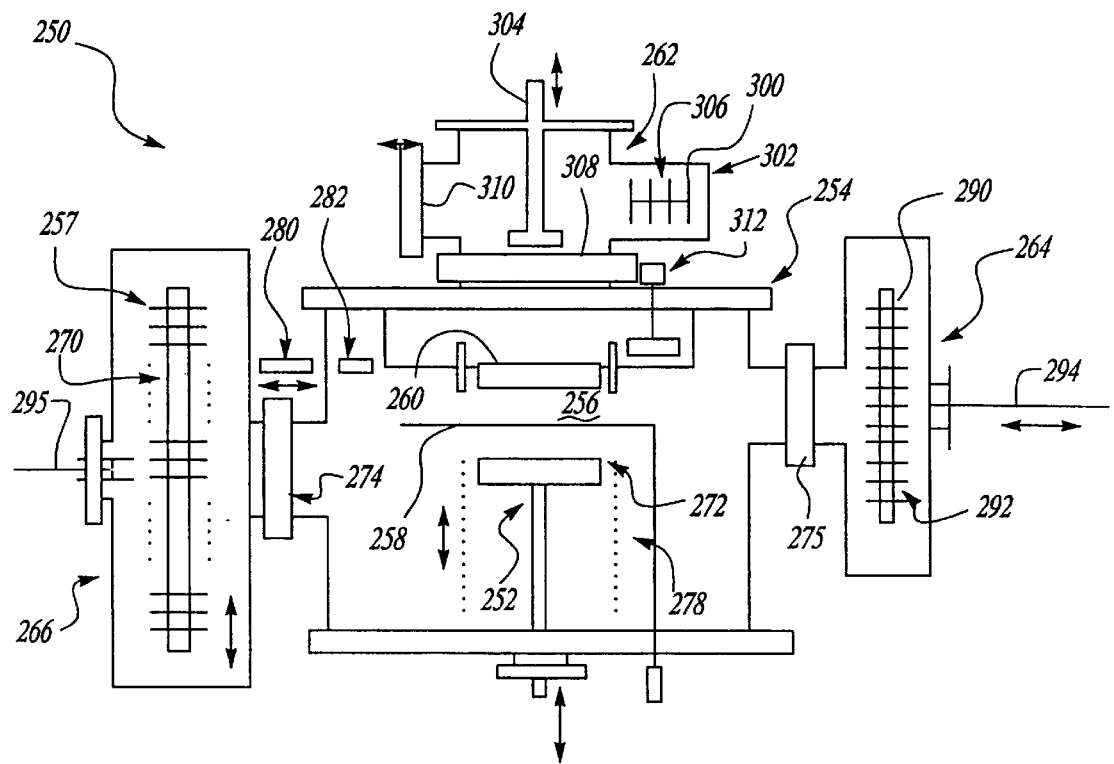
FIGS. 12A and 12B schematically illustrate top and front views, respectively, of a representative multi-target sputtering system incorporating a shutter-mask system according to the present invention.
Figure 12B:
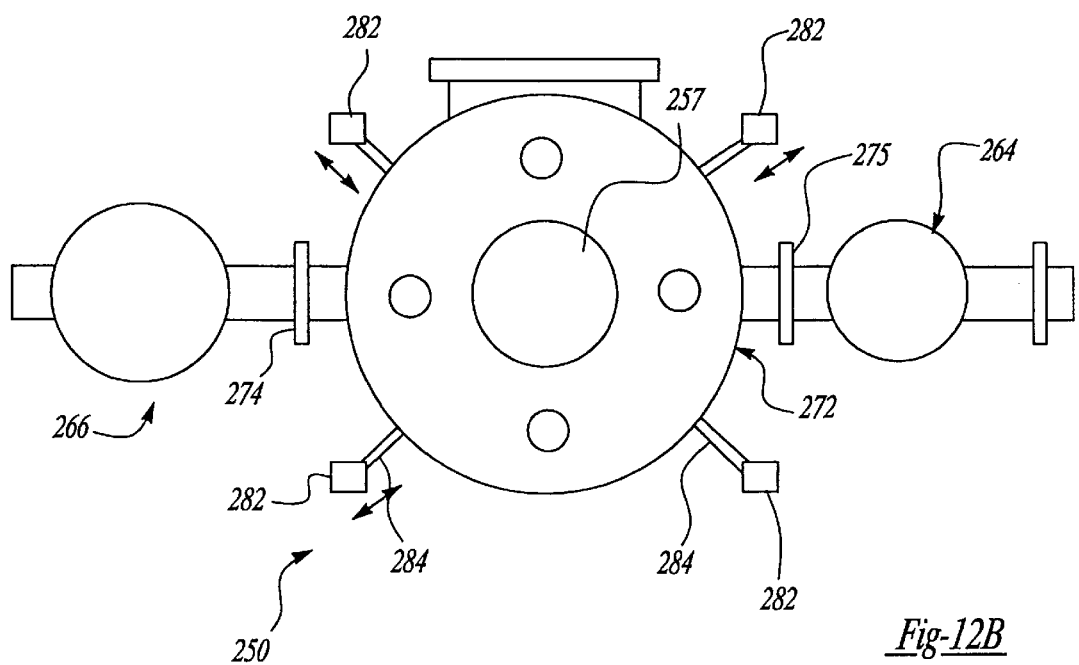

FIGS. 12A and 12B illustrate a specific embodiment of a multi-target sputtering system 250 according to the present invention. As discussed above, sputtering involved the ejection of surface atoms from an electrode surface by momentum transfer from bombarding ions to surface atoms. In this embodiment, sputtering is achieved by applying an electric field in the presence of a magnetic field to a target material that is held under vacuum ($10^{-11}$ Torr to $10^{-1}$ Torr) and in the presence of a gas, for example, argon, oxygen, nitrogen, etc. As shown in FIG. 12A, sputtering system 250 generally includes an enclosure assembly 254 housing a processing chamber 256 under vacuum, a sputter source or gun 252, a plurality of targets 257, and a susceptor or pedestal 258 having a substrate support surface 260 for supporting one or more substrates thereon. Sputtering system 250 may further include a substrate load-lock chamber 262, a physical mask chamber 264 and a target chamber 266 coupled to enclosure assembly 254 for loading/unloading of substrates, physical masks and targets into and out of processing chamber 256, as discussed in detail below.

Enclosure assembly 254 is preferably an integral housing made from a process compatible material, such as stainless steel or aluminum. Enclosure assembly 254 includes a gas inlet (not shown) for introducing process gases into chamber 256, and a gas outlet (not shown) for discharging the process gases. A vacuum system includes a pump (not shown) disposed exterior to assembly to provide vacuum pressure within chamber and to discharge the gases through outlet. Usually, the pressure within processing chamber 254 is monitored with a pressure sensor, such as a manometer, and controlled by varying the flow cross-sectional area of an gas outlet with a throttle valve (not shown). System 250 will preferably include a processor that receives from the manometer signals that indicate the chamber pressure. The processor will compare the measured pressure value with set point pressure values entered by operators (not shown), and determine the necessary adjustment of the throttle valve that is required to maintain the desired pressure within chamber 254.

Figure 13:
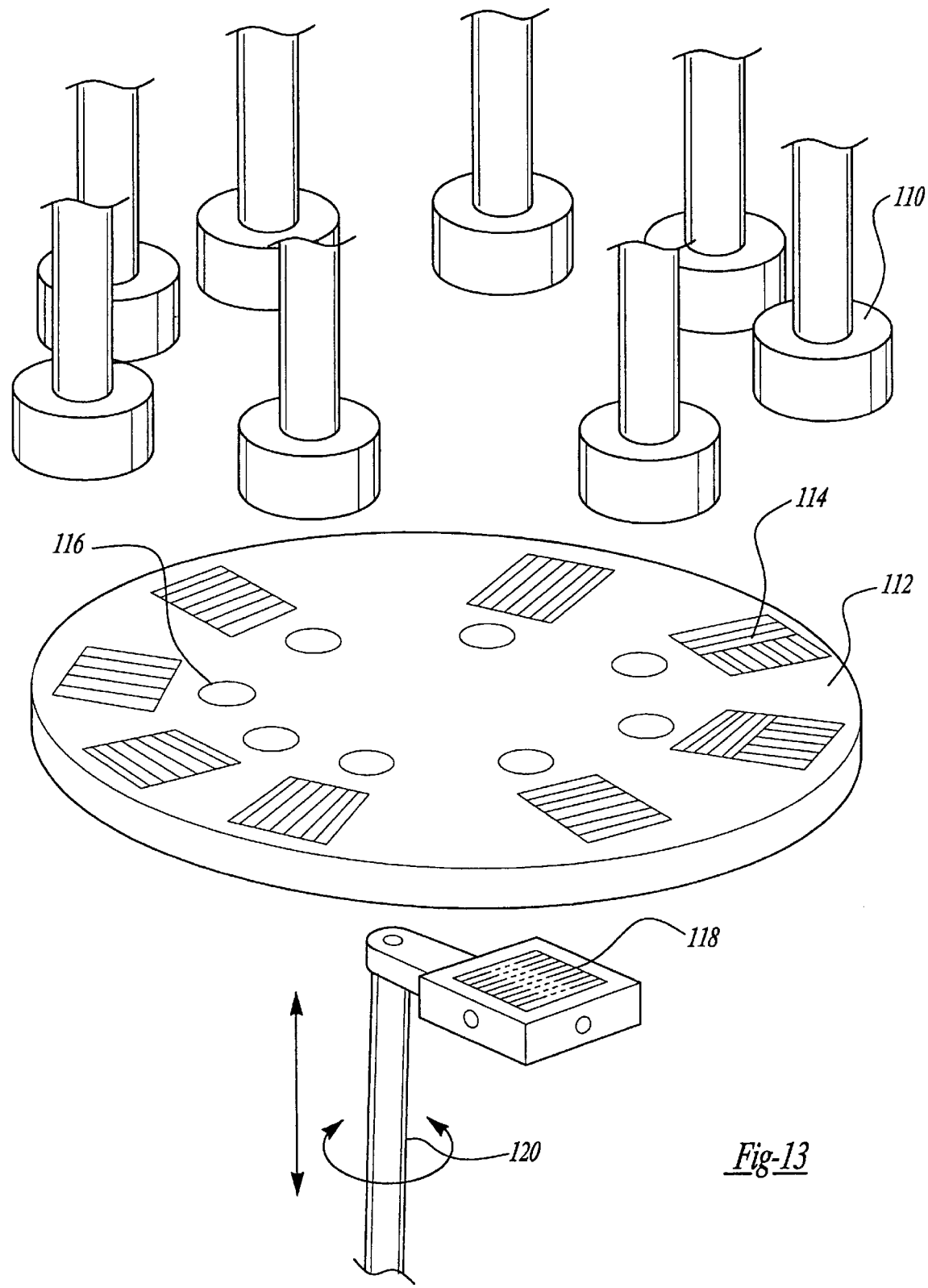
FIG. 13 illustrates an example of an alternative sputtering system employing an eight RF magnetron sputtering gun and a carrousel.
Figure 14:
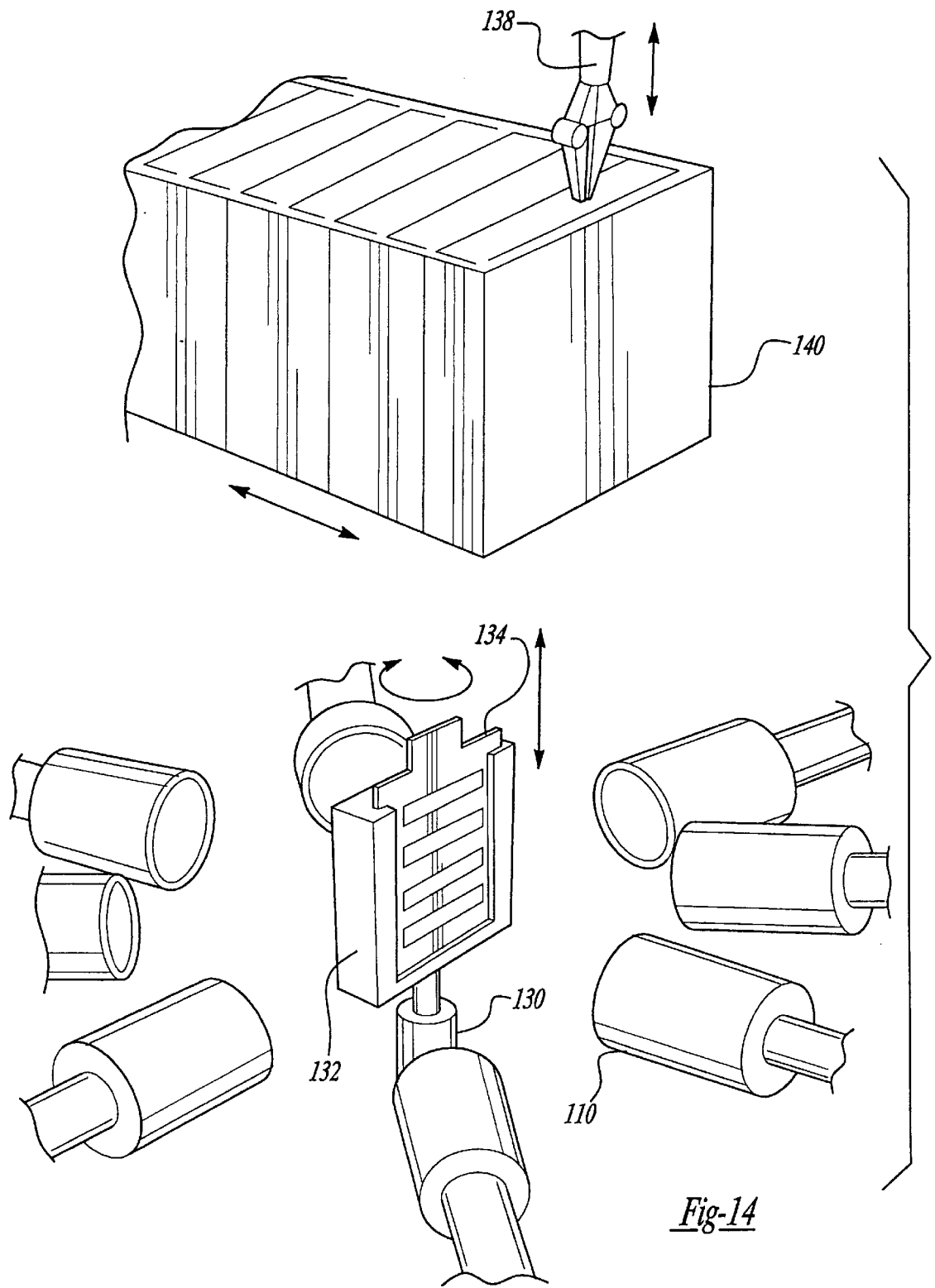
FIG. 14 illustrates an example of yet another sputtering system employing an eight RF magnetron sputtering gun and a cassette.

Sputtering source 252 is preferably an RF magnetron sputtering gun that functions to deposit one or more components from one or more targets 257 onto a substrate. A suitable RF sputtering gun for use in the present invention is commercially available under the tradename MightyMak™ from U.S. Thin Film Products, Inc., of San Jose, Calif. In the preferred embodiment, a single sputter source or sputter gun 252, with in-situ target change capabilities, is used rather than a typical multi-sputter source (FIGS. 13 and 14 illustrate a multi-sputter source). Accordingly, targets 257 are held to the sputtering source 252 by a magnetic force so that in-situ target change is possible. The sputtering source can have either a balanced or unbalanced magnetic field. In one embodiment, each target 257 includes a single target material so that component(s) from only one target material are deposited onto the substrate at any particular time. Chambers 266 and 244 are preferably separate to minimize contamination of the substrate with target materials other than the desired target material. Targets 257 are preferably housed within target chamber 266 on a target storing rack 270. During processing, the targets 257 are loaded and unloaded in-situ onto a frame 272 within processing chamber 256 by an automated robotic assembly 295. Preferably, sputtering targets are contained inside the vacuum so that no target conditioning is required each time a new target is used. A gate valve 274 is provided between target chamber 266 and processing chamber 256 to minimize contamination of the substrate and the targets within target chamber 266.

In an alternative embodiment (not shown in the drawings), sputtering system 250 will employ multi-target material targets to allow rapid target change and to allow components of more than one target material to be deposited onto the substrate in parallel or simultaneously. In this embodiment, each target preferably comprises a plurality of discrete sections or chambers that each include a target material. A physical mask (not shown) is located between the target and the sputtering source for blocking all of the discrete sections except for the selected section so that the operator can selectively determine which target material will be used to deposit components onto the substrate. Either the physical mask or the target will be movable relative to each other so that the target material that is exposed to sputtering source can be changed rapidly during processing. In one embodiment, for example, the system includes a drive (not shown) for rotating the target relative to the physical mask. In this embodiment, the target material sections are located around the periphery of the target, and the mask includes an opening sized such that the opening can be aligned with each chamber as the target is rotated. In another embodiment, the system may include a deposition shutter mask that rotates and/or translates to selectively expose the target material's sections of the target to the substrate. Enclosure chamber 256 also preferably includes an annular shield 278 surrounding the sputter source 252 for inhibiting deposition of components of the target material(s) onto the inner surfaces of the chamber and the surfaces of the assemblies within the chamber.

Referring again to FIG. 12A, sputtering system 250 preferably includes a masking shutter system 280 located between the targets 257 and substrate support surface 260 for generating arrays of resulting materials on the substrate that differ slightly in composition, thickness and stoichiometry. Masking shutter system 280 may include both shutter masks (up to 4 or more) and/or standard physical masks with an automatic mask changing device (discussed below). In the preferred embodiment, masking shutter system 280 includes at least four shutter masks 282 that can each be independently reciprocated with actuators 284 as described above in reference to FIG. 5. As shown in FIG. 12B, shutter masks 282 are slidably mounted to mounting rails 284 so that masks 282 can be reciprocated between target 257 and the substrate (not shown in FIG. 12B). Preferably, rails 284 are coupled to one or more drives (not shown) that allow rails 284 and masks 282 to be rotated and translated with respect to the substrate so that the entire masking system 280 can be positioned at different regions of the substrate (not shown).

Preferably, shutter masks 282 are flat, substantially continuous physical masks (i.e., no openings) similar to the masks described above in reference to FIG. 5. However, shutter system 280 may also include a variety of physical masks 290 having different sizes, shapes, and patterned openings for delivering component(s) through the openings to the substrate. As shown in FIG. 12A, these additional masks 290 are preferably stored on a mask storage rack 292 in mask chamber 264, and are loaded/unloaded into processing chamber 256 by a suitable automatic positioning device, such as a transfer rod 294, robotic loader, etc. The masks are translated along the mask storage rack, and the transfer rod removes a selected mask from the rack and loads it into the processing chamber. Alternatively, shutter system 280 may include a translation system comprised of masks contained on a strip of material that can be wound onto a roll so that the masks can be displayed in serial fashion by unwinding and winding said rolls.

Referring again to FIG. 12A, the individual substrates 300 are preferably stored in a separate, load-locked chamber 302 having a vacuum lock door 310 so that the chamber may or may not be held under vacuum. As shown, a robotic loading assembly 304 transfers substrates 300 from a storage rack 306 within chamber 302, through an aperture 308 within enclosure assembly 254, and onto substrate support surface 260 of pedestal 258. Of course, chamber 302 may be under vacuum to expedite the loading/unloading of different substrates 300 into the processing chamber, if desired.

Pedestal 258 is preferably made from a material having a relatively high thermal mass and good thermal conductivity to facilitate the absorption of heat from the substrate resting on support surface 260. Pedestal 258 may also include a cooling or heating system (not shown) for cooling or heating substrates 300 during processing. As shown in FIG. 12A, system 250 includes a rotational drive 312 coupled to pedestal 258 for rotating the pedestal and the substrate relative to shutter masks 282. Preferably, drive 312 comprises a rotary feed-through and a stepper motor. In an exemplary embodiment, the system will include thickness monitors (not shown) for measuring the thickness of the deposited component on the substrate in situ. The thickness monitors may provide feedback to the processor to control the deposition rate.

An alternative embodiment of a sputtering system incorporating multiple sputtering guns and multiple targets is shown in FIG. 13. As shown, sputtering system may comprise, for example, eight different RF magnetron sputtering guns 110, each of which contains a target material of interest. The eight RF magnetron sputtering guns are located about 2 to about 5 inches above a disk 112 containing thereon eight masking patterns 114 as well as eight film-thickness monitors 116. The substrate 118, however, is coupled to a substrate manipulator 120 which is capable of linear and rotational motion and which engages the substrate with the particular mask of interest so that the substrate is in contact with the mask when the sputtering begins. Combinations of the eight target materials are generated on the substrate by the sequential deposition of component(s) of each target material through its respective mask. This entire system is used in vacuo.

It is also possible to give the disk 112, which contains thereon the eight masking patters 114, rotational motion, thereby providing the flexibility needed to match any of the 8 target materials with any of the eight masking patterns 114. With this flexibility, it would be advantageous to increase the capacity of the disk 112 to more than eight masking patterns 114 so that component(s) of a target material can be deposited through multiple masking patterns. This is particularly useful when different film thicknesses of a given component are needed at different sites within the library. In addition, this system can be converted from a polar coordinate system to a X-Y coordinate system wherein the sputtering guns, the masks and the substrate are in a rectangular configuration.

Another alternative design for a combinatorial sputtering system is illustrated in FIG. 14. This system comprises eight RF magnetron sputtering guns 110, each of which contains a target material of interest, inserted from the side of the reaction chamber in a complete circle. The substrate is attached to a shaft 130 having linear and rotational motion. As such, during deposition, the substrate can be translated and rotated to face any one of the eight RF magnetron sputtering guns 110. The substrate is located within a substrate holder 132 which, in addition to holding the substrate, also locks one secondary masking pattern 134 firmly above the substrate 118 (the primary mask is the grid which defines the size and density of the reactions sites on the substrate and which is held fixed during the entire experiment). After deposition of a component, a manipulator 138 is used to remove the secondary mask, to place it in a cassette 140, to remove the next desired secondary mask, and to place this mask above the substrate holder 132. The locking mechanism on the substrate holder will assure the alignment of the mask preferably within 25 $\mu$m. (It will be readily apparent to those skilled in the art that there are multiple schemes and designs for locking mechanisms which will align a substrate to a mask with an accuracy better than 25 $\mu$m.) In the configuration illustrated in FIG. 7, the manipulator 138 has linear motion in the vertical direction, and the cassette 140 has linear motion in the horizontal direction. With this format, the manipulator 138 can be used to translate any of the secondary masks in the cassette 140. This design applies preferably to the use of 2 masks, more preferably to the use of 8 masks, even more preferably to the use of 20 masks, and still more preferably to the use of more than 20 masks. Using this system, component(s) of all of the target materials of interest can be deposited through distinct masking patterns, thereby creating a combinatorial library of layered materials.

B. Multi-Target Laser Deposition Systems

Figure 15:
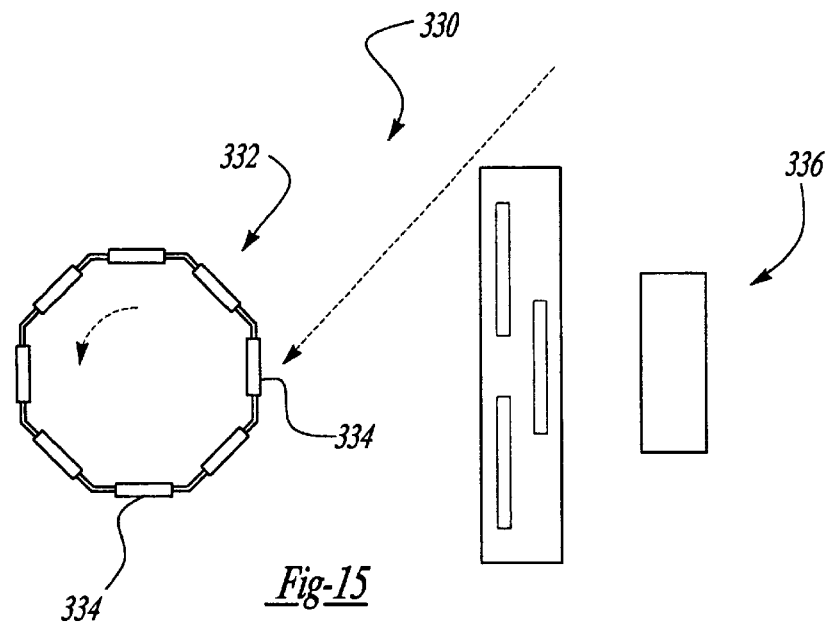
FIG. 15 is a schematic view of a representative multi-target laser system incorporating the shutter-mask system of FIG. 5 according to the present invention.
Figure 16:
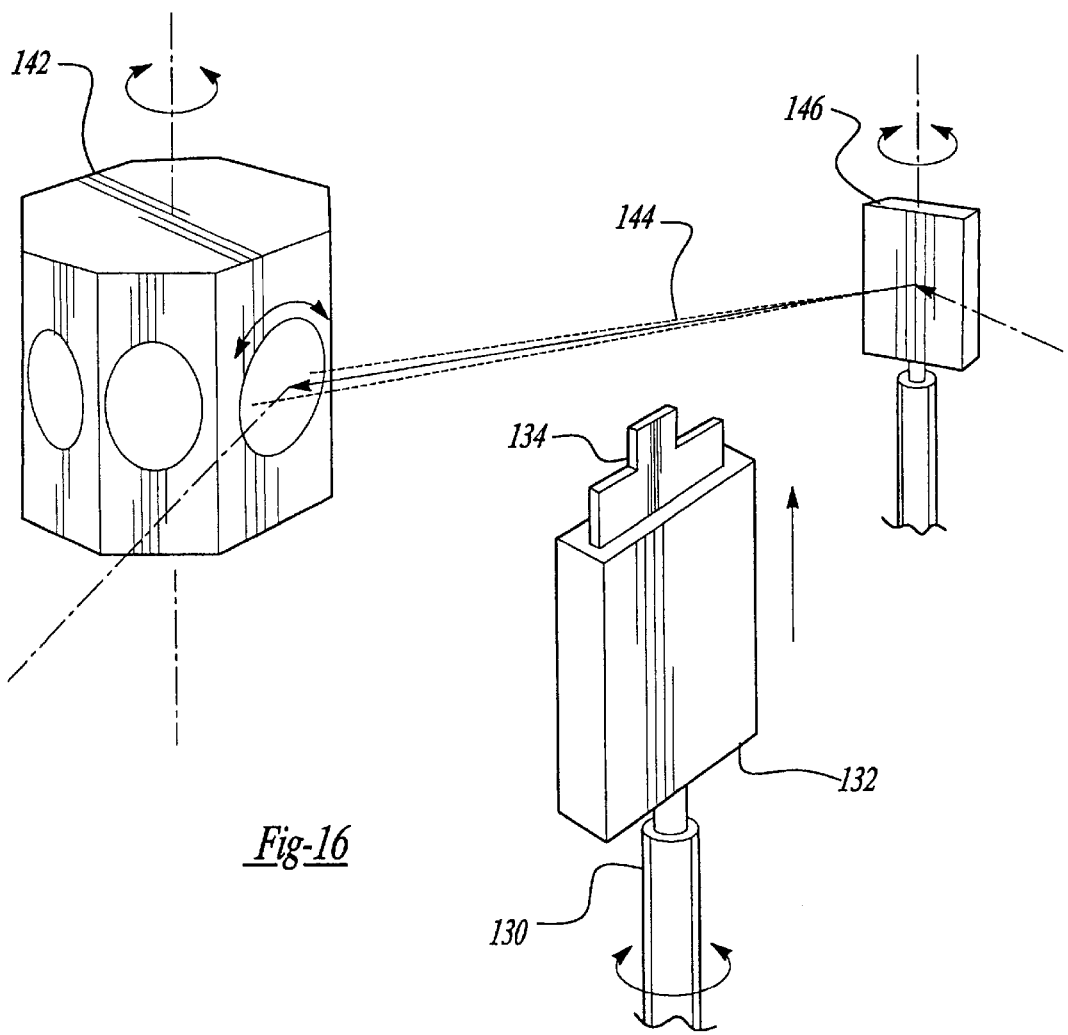
FIG. 16 illustrates an alternative embodiment of a multi-target laser system incorporating a movable substrate support.

Referring to FIGS. 15 and 16, two embodiments of a multi-target pulsed laser deposition system will now be described. The laser deposition systems are similar to the aforementioned sputtering systems, except a laser is used to control the removal of components from the target rather than using a sputtering gun. Laser deposition is achieved by irradiating a target material that is held under vacuum ($10^{-11}$ Torr to $10^{-1}$ Torr, or even atmosphere or greater). As discussed above, an excimer laser, YAG laser or any other continuous or pulse laser, having sufficient power to cause evaporation, is directed through a viewport to a target material held under vacuum. The target material is vaporized, the vapor is transported from the target to a substrate, and the vapor is condensed to a solid, thin-film on the substrate surface.

In comparison to sputtering thin-film deposition techniques, laser deposition techniques provide greater flexibility and speed in terms of interchanging the components of different target materials. This is because laser deposition provides a method for rapidly contacting a succession of different target materials with the laser beam by moving said targets into and out of said laser beam. By irradiating target materials in a rapid succession, it is possible to deposit mixtures of different target materials onto the substrate, rather than one target material at a time. In general, a laser deposition system enables the building of resulting materials onto a substrate to atomic levels faster than a sputtering system, thereby enabling the synthesis of arrays faster. One disadvantage of laser deposition techniques is that they tend to have reduced uniformity over areas greater than 1 $cm^2$. However, several techniques are currently being used with lasers to yield uniform surfaces of up to 100 $cm^2$. The first and most common of such techniques is to move the substrate in a planetary motion during the deposition of a component. The planetary motion ensures that the plume of ejected components are spread evenly throughout the substrate. The cost of moving the substrate during deposition is a reduction in speed since, in effect, many 1 $cm^2$ depositions are required to evenly cover a circle of, for example, 5 cm in diameter.

FIG. 15 schematically illustrates a laser deposition system 330 including a movable container holder or target wheel 332 (e.g. a wheel, polygon, disc or other configuration) constructed such that it can rotate target materials 334 into and out of the path of the laser beam rapidly (e.g. less one second to minutes). Usually, the target wheel 332 can hold more than one target material 334 and preferably eight or more target materials 334. Thus, after the laser (not shown) irradiates the first target material, the target wheel 332 may be immediately rotated to present a second target material for irradiation. If the target wheel 332 is moving fast, the vapors derived from the first and second target materials can intermingle before they are deposited onto the substrate 336. The laser system 330 incorporates the shutter masks shown in FIG. 5 to control the deposition of the irradiated target materials onto substrate 336, as described above.

Referring to FIG. 16, a system related to the one described above is that of the laser deposition system having a cassette exchange mechanism. In this embodiment, the target materials are placed on a different face of a polygon 142 which can hold at least 4 target materials and, more preferably, at least 8 target materials. If, for example, the polygon is a decagon, then ten target materials can be mounted upon it. An alternative approach is to place each target materials in a carrousel wheel. With either design, the goal is to be able to rapidly move target materials in front of a laser beam 144 for a specific period of time, and then change target materials almost instantaneously. In the carrousel embodiment, the target materials can be quickly rotated to intersect the laser beam 144. In the polygon embodiment, the target materials can be interchanged by spinning the desired polygon face to the front where the laser beam 144 is fixed.

Another approach to achieving uniformity over large areas during the deposition of components of target materials is a technique that uses a rastered laser beam. In this design illustrated in FIG. 16, a programmable mirror 146 allows the laser beam to be rastered over the entire diameter of the deposition target, i.e., the target materials. By varying the speed of the rastering laser beam as a function of position, the ablation plume can be generated for longer periods of time near the outer edge of the substrate to yield uniform films. This technique also has the advantage of always producing a consistent plume as a function of time.

For the system illustrated in FIG. 16, the substrate is mounted on a shaft 130 which can be rotated and translated vertically. Moreover, in addition to using a rastering laser beam, each ablation target, i.e., target materials, rotates so as to expose the entire surface of the target to the laser beam. This improves the uniformity of the deposition for areas greater than 1 square inch. As described above with respect to the system illustrated in FIG. 16, the substrate is placed within a sample holder 132, and a mask 134 is attached to the substrate holder 132 in front of the substrate. The mask 134 is aligned correctly with the substrate through the use of a locking mechanism. The accuracy of the locking mechanism should preferably be better than 25 $\mu$m. In between deposition steps, the mask may be interchanged, without breaking the vacuum, with one of the other masks held in the cassette within the reaction chamber. The general procedure used to exchange the masks was described above.

C. Electron Beam and Thermal Evaporation Systems

Figure 17:
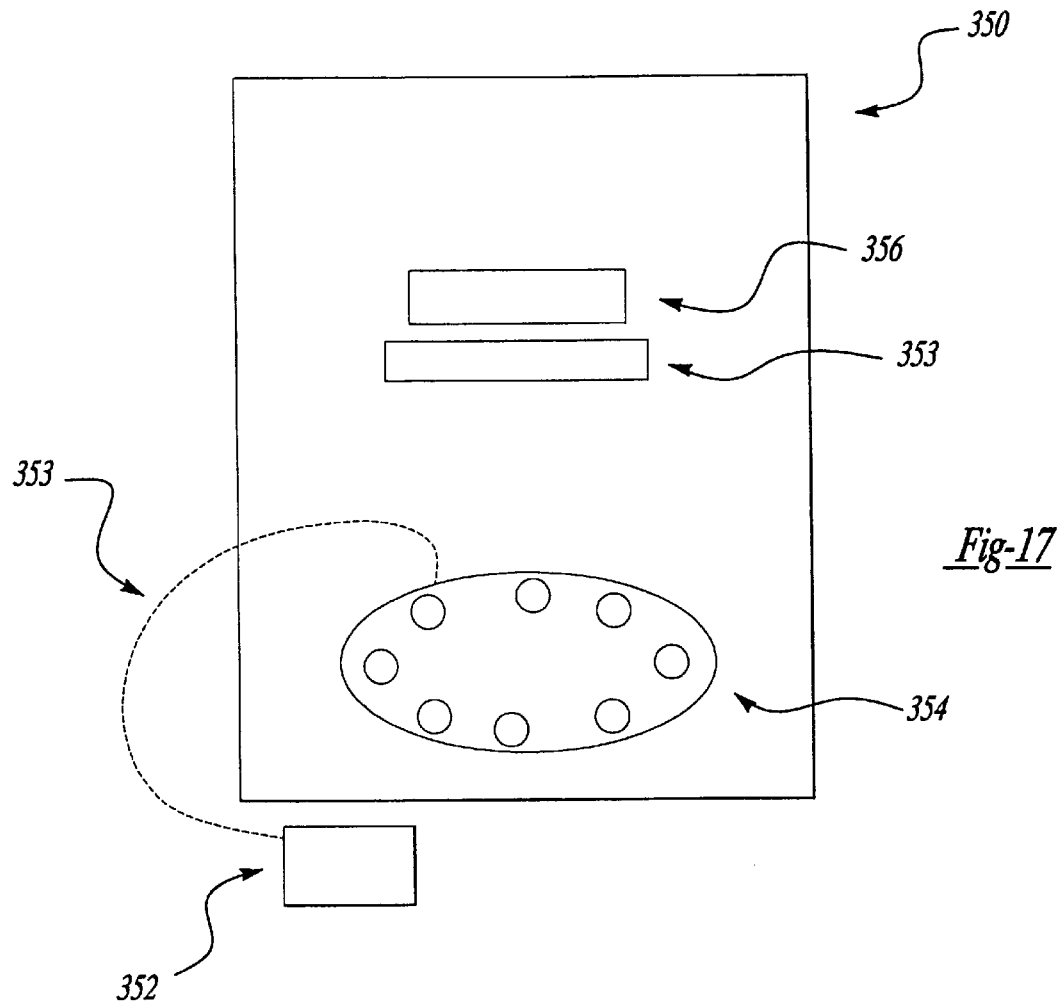
FIG. 17 illustrates a schematic view of a representative multi-target electron beam system incorporating the shutter-mask system of FIG. 5 according to the present invention.

Referring to FIG. 17, an electron beam or thermal evaporation system 350 according to the present invention will now be described. Generally, an electron beam is applied to a target material under vacuum (for example, about $10^{-11}$ Torr to about $10^{-3}$ Torr), such that the vacuum allows the vapor from the target material to diffuse up to the masked substrate with very little resistance. A processing gas, for example, argon, oxygen, nitrogen, etc., can be infused into the system to create a reactive environment. The distance between the target and the substrate typically determines the uniformity of the film that deposits onto the substrate. The greater the distance between the target and the substrate, the greater the uniformity of the film.

As schematically shown in FIG. 17, electron beam system 350 includes an electron beam gun 352, which is either a multi-electron beam gun or an electron gun with a single electron beam and a masking system 353 for controlling deposition of target materials 354 onto a substrate 356. As discussed above, electron beam system 350 may employ both masking shutters and/or standard physical masks with an automatic mask changing device (not shown). Different target materials 354 (e.g. metals, oxides, nitrides, fluorides, sulfides, or any material with a sufficient vapor pressure) are melted in individual containers made of, for example, carbon. Configurations of the apparatus can include any number of targets, for example 1, 4, 10, or more, wherein one electron beam 353 is used and each target 354 is irradiated sequentially. Alternatively, the apparatus can include any number of targets, for example 1, 4, 10, or more, and any number of electron beams, such that each target is irradiated by one electron beam, wherein if more than one electron beam is used, the targets can be irradiated simultaneously. Alternatively, the apparatus can include any number of targets, for example 1, 4, 10, etc., and any number of electron beams, and each beam can be applied to more than one target such that some targets are irradiated simultaneously and some targets are irradiated sequentially. Therefore, components of target materials can be selectively deposited onto the substrate 356 sequentially, simultaneously as a mixture of two or more target materials, or using a combination of sequential and simultaneous deposition. The electron beam system may further include thickness monitors (not shown) for measuring the thickness of the deposited target material on the substrate in situ. The thickness monitors may provide feedback to the processor to control the deposition rate.

Similar to electron beam techniques, films may be deposited onto a substrate using thermal evaporation. In this embodiment, an electric current is applied to the target to heat the target material until the material evaporates. The evaporated material may then be applied to the substrate. As before, components of target materials can be selectively deposited onto the substrate 356 sequentially, simultaneously as a mixture of two or more target materials, or using a combination of sequential and simultaneous deposition.

D. Spray Coating System

In spray-coating, sprayers, such as ultrasonic nozzle sprayers, air atomizing nozzle sprayers, and atomizing nozzle sprayers, etc., are employed to deposit materials onto a substrate. In ultrasonic sprayers, disc-shaped ceramic piezoelectric transducers convert electrical energy into mechanical energy to produce a spray. In air atomizing sprayers, the nozzles intermix air and liquid streams to produce a completely atomized spray. In atomizing sprayers, the nozzles use the energy from a pressurized liquid to atomize the liquid to produce a spray. Film thickness and uniformity can be controlled by the spraying time, substrate-nozzle distance, nozzle pressure, liquid viscosity, and/or positioning the spray gun, spray nozzle or substrate, etc.

Figure 18:
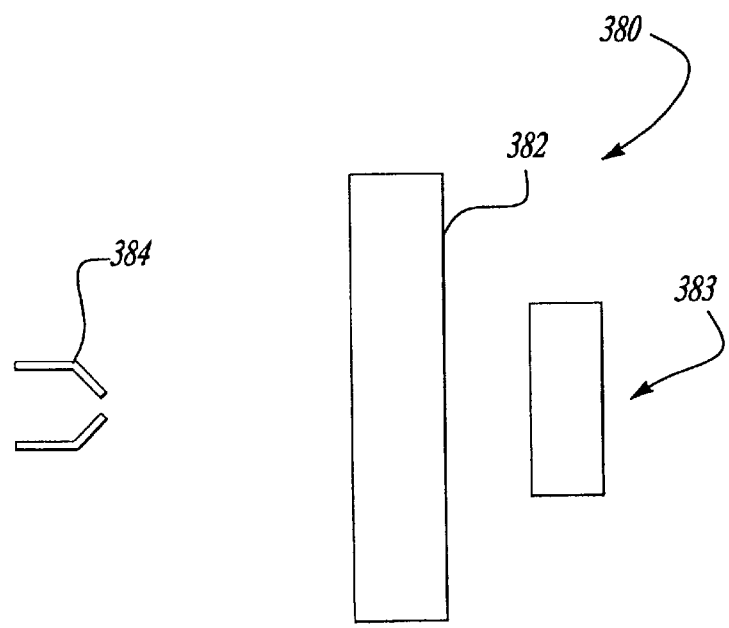
FIG. 18 illustrates a schematic view of a representative multi-target spray coating system incorporating the shutter-mask system of FIG. 5 according to the present invention.

In a preferred embodiment of a spray coating system 380 (FIG. 18), combinatorial libraries can be produced by depositing components in successive rounds onto a masked substrate 383 by spraying said components through a nozzle 384. Spray coating system 380 can employ both masking shutters and/or standard physical masks with an automatic mask changing device, as discussed above. In alternative embodiments, multiple spray heads may be used in this system.

E. Ion Beam Deposition System

In ion beam deposition, an ion beam is applied to a target material under vacuum ($10^{-11}$ to $10^{-1}$ Torr) in the presence of a gas, such as argon. The ion beam irradiates the surface of the target material so that the surface atoms are physically displaced from the target. The ion beam can be generated, for example, from one or more ion source guns that are spaced from the target materials, similar to the system configurations shown in FIGS. 15–17.

V. Delivery Using A Dispenser

In addition to the foregoing delivery techniques, dispensers can be utilized to generate diverse combinations of components in the form of droplets or powder on a single substrate. As explained above, commercially available micropipetting apparatus can be adapted to dispense droplet volumes of 5 nanoliters or smaller from a capillary. Such droplets can fit within a predefined region having a diameter of 300 $\mu$m or less when a non-wetting mask is employed. In some embodiments, the micropipette is accurately and precisely positioned above the predefined regions, as described below, before the solution is deposited.

In a different preferred embodiment, the present invention employs a solution depositing apparatus that resembles devices commonly employed in the ink-jet printing field. Such ink-jet dispensers include, for example, the pulse pressure type, the bubble jet type and the slit jet type. In an ink-jet dispenser of the pulse pressure type, the printing ink is jetted from a nozzle according to a change in pressure applied by a piezoelectric device. In an ink-jet dispenser of the bubble jet type, bubbles are generated with heat generated with a resistance device embedded in a nozzle, and printing ink is jetted by using the force due to the expansion of a bubble. In an ink-jet dispenser of the slit jet type, printing ink is filled within a slit-like orifice wherein recording electrodes are aligned in correspondence to pixels, and a DC voltage pulse is applied between a recording electrode and a counter electrode arranged behind a recording paper. In this system, the printing ink around the top of the record electrode is charged electrically so that the ink is ejected towards the recording paper with an electrostatic force to record a dot on the paper.

Such ink-jet printers can be used with minor modification by simply substituting a component containing solution or component containing powder for the ink. For example, Wong, et al., European Patent Application EP 0 260 965, incorporated herein by reference for all purposes, describes the use of a pulse pressure type ink-jet printer to apply an antibody to a solid matrix. In the process, a solution containing the antibody is forced through a small bore nozzle that is vibrating in a manner that fragments the solution into discrete droplets. The droplets are subsequently charged by passing through an electric field and then deflected onto the matrix material.

For illustrative purposes, a conventional ink drop printer of the pulse pressure type includes a reservoir in which ink is held under pressure. The ink reservoir feeds a pipe which is connected to a nozzle. An electromechanical transducer is employed to vibrate the nozzle at some suitably high frequency. The actual structure of the nozzle may have a number of different constructions, including a drawn glass tube which is vibrated by an external transducer, or a metal tube vibrated by an external transducer (e.g., a piezoelectric crystal), or a magnetostrictive metal tube which is magnetostrictively vibrated. The ink accordingly is ejected from the nozzle in a stream which shortly thereafter breaks into individual drops. An electrode may be present near the nozzle to impart a charge to the droplets.

Figure 19:
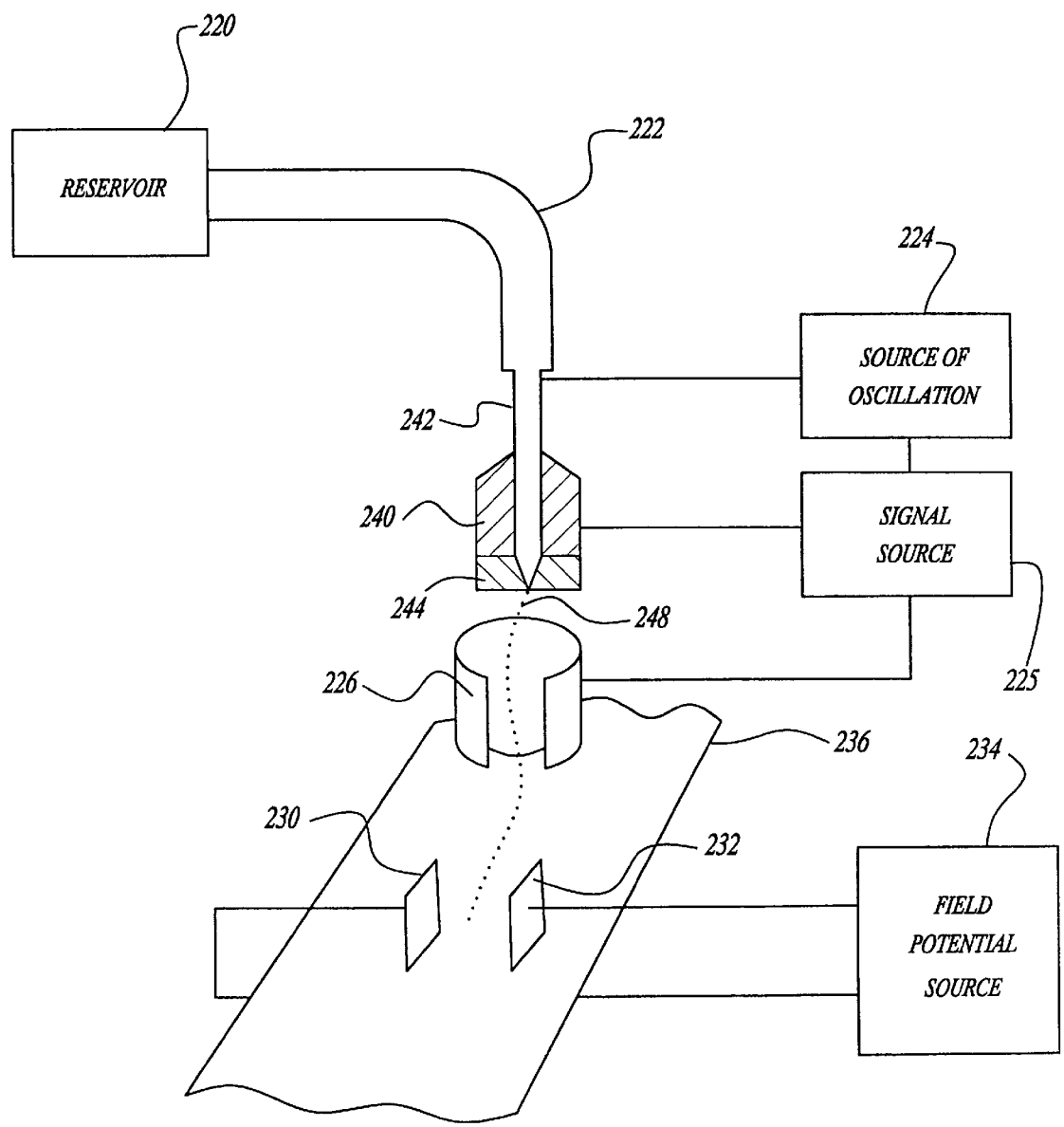
FIG. 19 displays the elements of a typical guided droplet dispenser that may be used to deliver the component solution(s) of the present invention.

A schematic drawing of an ink drop dispenser of the pulse pressure type (such as is described in U.S. Pat. Nos. 3,281,860 and 4,121,222, which are incorporated by reference herein for all purposes) which may be employed in the present invention is shown in FIG. 19. This apparatus comprises a reservoir 220 which contains a solution under pressure. Tubing 222 is connected to the reservoir 220 and terminates in a metal nozzle 242. Nozzle 242 is disposed within a hole provided in piezoelectric crystal 240. The end of the metal tube and of the piezoelectric crystal are made to coincide. The tubing and the piezoelectric crystal are soldered together to form a permanent waterproof attachment. The coincident ends of the crystal and the tubing are covered with a washer 244 which is termed an orifice washer. This washer has an opening 246 drilled therethrough through which the solution is emitted under pressure. A source of oscillations 224 is connected between the outside of the metal tubing 242 and the outside of the piezoelectric crystal 240. The construction is such that hermetic sealing can be employed which protects against electrochemical and atmospheric attack of the components.

The piezoelectric crystal 240 is vibrated substantially at the frequency of the source of oscillations causing the tubing and nozzle to vibrate whereby the solution stream breaks down into droplets 246. A signal source 225 which is synchronized by the source of oscillations is connected between the nozzle and the charging cylinder 226. As a result, each of the drops, which should be substantially the same mass, receives a charge, the amplitude of which is determined by the amplitude of the signal applied from the source 225 and the charging cylinder 226.

The charged drops, after passing through the charging cylinder, pass into an electric field which is established between two plates respectively 230 and 232 which are connected to a field potential source 234. As a result of the action between the field and the charge of each drop, the drops are deflected from their center line path between the plates in accordance with the charge which they carry. Thus, when they fall on an optionally moving writing medium 236, a deposition pattern occurs on the writing medium representative of the information in the signals.

Although the ink-jet printer of the pulse pressure type has been described in greater detail herein for purposes of illustration, it will be readily apparent to those of skill in the art that ink-jet printers of the bubble jet type and the slit jet type can also be used, with only minor modifications, to deliver components to predefined regions on the substrate. Moreover, although the foregoing discussion refers to a single nozzle, in a preferred embodiment, ink-jet printers having multiple nozzles are used to deliver multiple components to a single predefined region on the substrate or, alternatively, to multiple predefined regions on the substrate. In addition, as improvements are made in field of ink-jet printers, such improvements can be used in the methods of the present invention.

In other embodiments, the component solutions can be delivered from a reservoir to the substrate by an electrophoretic pump. In such a device, a thin capillary connects a reservoir of the component with the nozzle of the dispenser. At both ends of the capillary, electrodes are present to provide a potential difference. As is known in the art, the speed at which a chemical species travels in a potential gradient of an electrophoretic medium is governed by a variety of physical properties, including the charge density, size, and shape of the species being transported, as well as the physical and chemical properties of the transport medium itself. Under the proper conditions of potential gradient, capillary dimensions, and transport medium rheology, a hydrodynamic flow will be set up within the capillary. Thus, bulk fluid containing the component of interest can be pumped from a reservoir to the substrate. By adjusting the appropriate position of the substrate with respect to the electrophoretic pump nozzle, the component solution can be precisely delivered to predefined regions on the substrate.

Using the aforementioned dispenser systems, the components can be delivered to predefined regions on the substrate either sequentially or simultaneously. In a presently preferred embodiment, the components are simultaneously delivered to either a single predefined region on the substrate or, alternatively, to multiple predefined regions on the substrate. For example, using an ink-jet dispenser having two nozzles, two different components can be simultaneously delivered to a single predefined region on the substrate. Alternatively, using this same ink-jet dispenser, a component can be simultaneously delivered to two different predefined regions on the substrate. In this instance, the same component or, alternatively, two different components can be delivered. If the same component is delivered to both of the predefined regions, it can be delivered in either the same or different amounts. Similarly, using an ink-jet dispenser having eight nozzles, for example, eight different components can be simultaneously delivered to a single predefined region on the substrate or, alternatively, eight components (either the same or different) can be simultaneously delivered to eight different predefined regions on the substrate.

VI. Delivery Through Gas Manifolds

Figure 20:
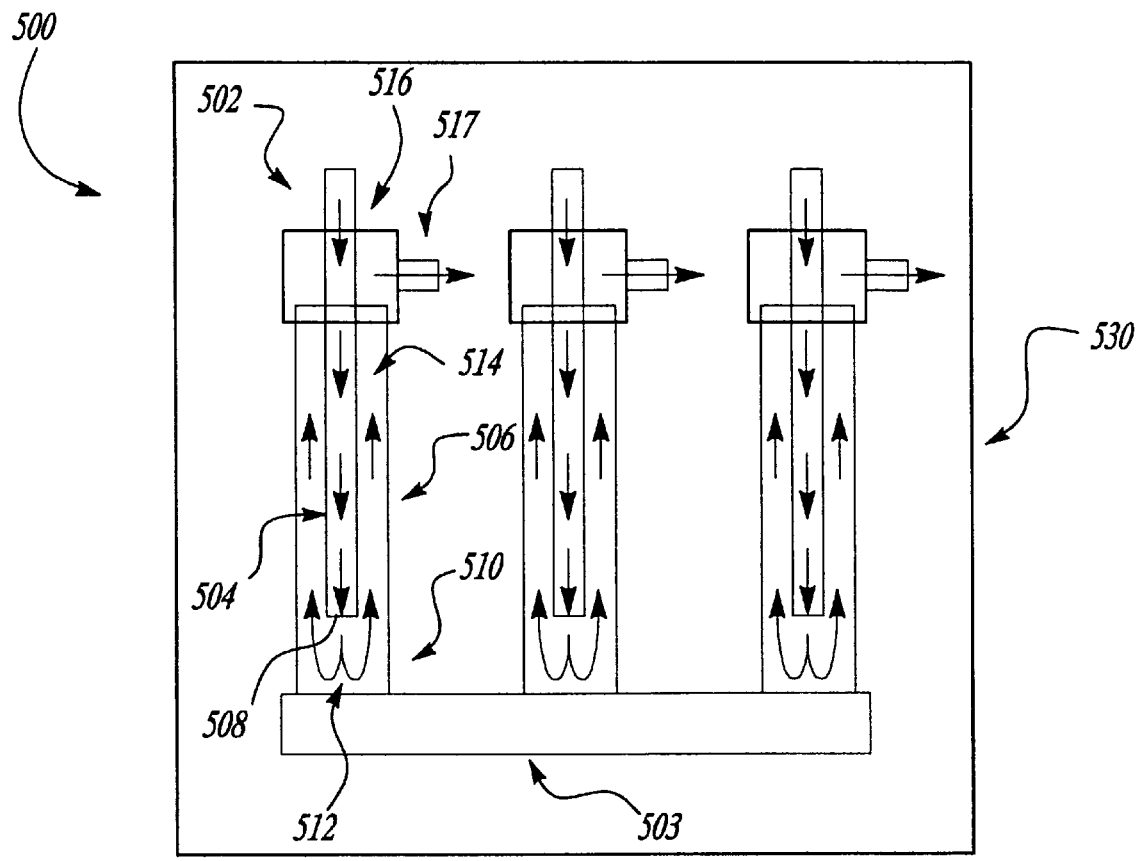
FIGS. 20 and 21 illustrate an alternative embodiment of the present invention wherein a gas manifold system is employed to deposit materials to predefined regions of the substrate.
Figure 21:
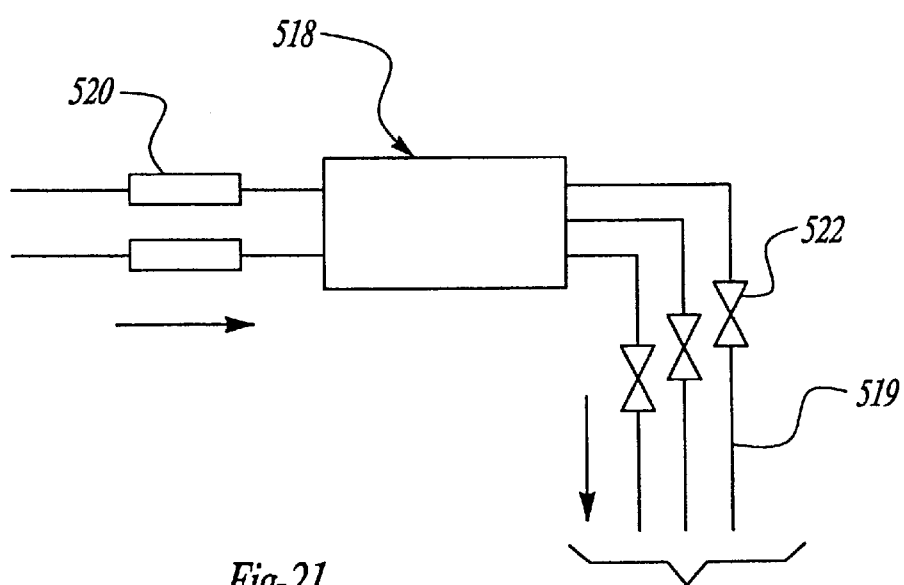

FIGS. 20 and 21 illustrate an alternative system and method for spatially delivering components to predefined regions on a substrate. This system and method generally provides spatial variation of gas mixture and gas exposure time over the substrate, and may be used alone or in combination with any of the physical masking systems described above. The system and method of FIGS. 20 and 21 may be used for material deposition (e.g., chemical vapor deposition, such as deposition from various precursors (hydrides, chlorides, organometallics, etc) or atomic layer epitaxy), material etching (i.e., thermal or atomic layer etching), chemical reaction studies, such as heterogenous catalysis or corrosion studies and/or material annealing and treatment (e.g., reduction, oxidation, diffusion, thermal growth of oxides, nitrides and other films) among other applications.

As shown in FIG. 20, system 500 includes an array of spaced gas exposure tube assemblies 502 for delivering gas(es) to predefined regions on a substrate 503. The number and spacing of gas exposure tube assemblies 502 will, of course, depend on the number and spacing of the predefined regions on the substrate 503. Each tube assembly 502 includes inner and outer concentric tubes 504, 506 for delivering and removing gas(es) to substrate 503. Typically, gas is delivered through inner tube 504, which has an outlet 508 spaced inward from the distal end 510 of outer tube 506. The gas flows vertically or horizontally through inner tube 504, interacts with a small region 512 of the substrate surface and is exhausted through the annular cavity 514 between tubes 504, 506. Of course, it will be recognized that flow may be in the reverse direction (i.e., delivered through cavity 514 to the substrate and exhausted through inner tube 504).

As shown in FIG. 20, tube assemblies 502 preferably include a proximal fitting 516 that fluidly couples an exhaust line 517 with cavity 514. As shown in FIG. 21, inner tubes 504 are each coupled, via supply lines 519, to one or more gas manifolds 518. Preferably, gas manifolds 518 are common to more than one of the inner tubes 504. A mixture of gases controlled by mass flow controllers 520 are fed into manifold(s) 518. The different manifolds may be set up with different concentrations of a gas mixture or completely different gas mixtures. Supply lines 519 preferably each have independently controlled valves 522 for varying the gas mixture applied to each region 512 of the substrate 503, and/or for varying the exposure time of the gases within manifold(s) 518 to each predefined region 512. Varying the exposure time may impact deposition thickness, etch depth or reaction time at region 512. For reaction studies, exhaust lines 517 may also include two-way valves (not shown) so that each line can be sampled to facilitate rapid, sequential screening of the reaction regions.

In use for deposition, one or more gases are delivered in varying or equal concentrations to one or more of the gas manifold(s) 518 (FIG. 21). Valves 522 are opened and closed to allow the gas mixture within manifold(s) 518 to pass from supply lines 519 through inner tubes 504 to the region 512 over the substrate 503 (FIG. 20). The exposure time of each region 512 to the gas(es) can be varied by varying the amount of time each valve 522 is opened, or by varying the flow rate through each valve 522. As shown in FIG. 20, each exposure is preferably localized by contacting the substrate 503 with distal end 510 of outer tubes 506. In addition, tube assemblies 502 are preferably located within a vessel 530 that is purged with an inert gas maintained at a slightly higher pressure than the gas within exposed regions 512. This pressure difference leads to an inward leakage of the inert gas rather than an outward leakage of the reactants.

This system and method can be illustrated by an example of a combinatorial study of ZnS:Mn as an EL phospor. In this example, system 500 will be used to determine the best manganese concentration and the best phophor layer thickness. For the example, it will be assumed that each row of an array of tube assemblies 502 are supplied by a different common manifold 518. The manifold for row one is set up with a gas mixture having a manganese concentration of 0.01%, the manifold for row two is provided with manganese concentration of 0.02%, and so on.

In this example, the valves 522 along the supply lines 519 of column one of the array are programmed to close after 1000 Angstroms of material has been deposited, the valves 522 along the supply lines 517 of column two of the array will close after 5000 Angstroms of material is deposited and so one. The resulting library will have a pixel array of ZNS:Mn where one axis of the array corresponds to varying manganese concentration and the other axis corresponds to varying material thickness. The array may then be screened to rank the relative performances of each material within the array.

VII. Isolation of Regions on a Substrate

In a preferred embodiment, the above described systems and methods of the present invention are used to prepare an array of diverse resulting materials at known locations on a single substrate surface. Essentially, any conceivable substrate can be employed in the invention. The substrate can be organic, inorganic, biological, nonbiological, or a combination of any of these, existing as particles, strands, precipitates, gels, sheets, tubing, spheres, containers, capillaries, pads, slices, films, plates, slides, etc. The substrate can have any convenient shape, such a disc, square, sphere, circle, etc. The substrate is preferably flat, but may take on a variety of alternative surface configurations. For example, the substrate may contain raised or depressed regions on which the synthesis of diverse materials takes place. The substrate and its surface preferably form a rigid support on which to carry out the reactions described herein. The substrate may be any of a wide variety of materials including, for example, polymers, plastics, pyrex, quartz, resins, silicon, silica or silica-based materials, carbon, metals, inorganic glasses, inorganic crystals, membranes, etc. Other substrate materials will be readily apparent to those of skill in the art upon review of this disclosure. Surfaces on the solid substrate can be composed of the same materials as the substrate or, alternatively, they can be different, i.e., the substrates can be coated with a different material. Moreover, the substrate surface can contain thereon an adsorbent (for example, cellulose) to which the components of interest are delivered. The most appropriate substrate and substrate-surface materials will depend on the class of materials to be synthesized and the selection in any given case will be readily apparent to those of skill in the art.

In some embodiments, a predefined region on the substrate and, therefore, the area upon which each distinct resulting material is synthesized is smaller than about 25 $cm^2$, preferably less than 10 $cm^2$, more preferably less than 5 $cm^2$, even more preferably 1 $cm^2$, still more preferably less than 1 $mm^2$, and still more preferably less than 0.5 $mm^2$. In most preferred embodiments, the regions have an area less than about 10,000 $\mu m^2$, preferably less than 1,000 $\mu m^2$, more preferably less than 100 $\mu m^2$, and even more preferably less than 10 $\mu m^2$.

In preferred embodiments, a single substrate has at least 10 different materials, preferably at least 20 different materials, more preferably at least 50 different materials and, more preferably, at least 100 different materials synthesized thereon. In even more preferred embodiments, a single substrate has more than 500, $10^3$, $10^4$, $10^5$, $10^6$, or more materials synthesized thereon. In some embodiments, the delivery process is repeated to provide materials with as few as two components, although the process can be readily adapted to form materials having 3, 4, 5, 6, 7, 8 or more components therein. The density of regions per unit area will be greater than 0.04 regions/cm$^2$, more preferably greater than 0.1 regions/cm$^2$, even more preferably greater than 1 region/cm$^2$, even more preferably greater than 10 regions/cm$^2$, and still more preferably greater than 100 regions/cm$^2$. In most preferred embodiments, the density of regions per unit area will be greater than 1,000 regions/cm$^2$, more preferably 10,000 regions/cm$^2$, even more preferably greater than 100,000 regions/cm$^2$, and still more preferably 10,000,000 regions/cm$^2$.

In other embodiments, the substrate can be a series of small beads or pellets (hereinafter "beads"). The number of beads used will depend on the number of materials to be synthesized and can range anywhere from 2 to an infinite number of beads. In this embodiment, each of the beads is uniformly coated with the component(s) of interest and, thereafter, the beads can be reacted. This is readily done, for example, by using a series of vessels each of which contains a solution of a particular component. The beads are equally divided into groups corresponding to the number of components used to generate the array of materials. Each group of beads is then added to one of the vessels wherein a coating of one of the components in solution forms on the surface of each bead. The beads are then pooled together into one group and heated to produce a dry component layer on the surface of each of the beads. The process is repeated several times to generate an array of different components on each of the beads. Once the components of interest have been deposited on the beads, the beads can be reacted to form an array of materials. All of the beads may or may not be reacted under the same conditions, or have components deposited under the same conditions (i.e., when the beads or components do not react with each other). To determine the history of the components deposited on a particular bead, mass spectroscopic techniques can be used. Alternatively, each bead can have a tag which indicates the history of components deposited thereon as well as their stoichiometries. The tag can be, for example, a binary tag etched into the surface of the bead so that it can be read using spectroscopic techniques. As with the single substrate having an array of resulting materials thereon, each of the individual beads or pellets can be screened for resulting materials having useful properties.

More particularly, if an array of resulting materials is to be generated based on Bi, Cu, Ca and Sr using a series of beads as the substrate, for example, four vessels containing aqueous solutions of $Bi(NO_3)_3$, $Cu(NO_3)_3$, $Ca(NO_3)_3$ and $Sr(NO_3)_3$ would be employed. A portion of the beads are added to the vessel containing the $Bi(NO_3)_3$ solution; a portion of the beads are added to the $Cu(NO_3)_3$ solution; a portion of the beads are added to the vessel containing the $Ca(NO_3)_3$ solution; and, finally, a portion of the beads are added to the vessel containing the $Sr(NO_3)_3$ solution. Once the beads are uniformly coated with the material contained in the vessel, the beads are removed from the vessel, dried, etched, pooled together into one group and, thereafter, subsequently divided and added to the vessels containing the foregoing materials of interest. The process is optionally repeated, with additional materials, to form a vast array of materials on each of the beads. It will be readily apparent to those of skill in the art that a number of variations can be made to this technique to generate a vast array of beads containing a vast array of materials thereon. For example, some of the beads can be coated with only two materials, others with more than two materials. Additionally, some of the beads can be coated two or more times with the same material, whereas other beads are coated a single time with a given material.

VIII. Methods For Screening the Array of Materials

Once prepared, the array of resulting materials can be screened sequentially or in parallel for resulting materials having useful properties. Either the entire array or, alternatively, a section thereof (e.g., a row of predefined regions) can be screened in parallel (or fast sequential screening) for resulting materials having useful properties. Scanning detection systems are preferably utilized to screen an array of resulting materials wherein the density of regions per unit area will be greater than 0.04 regions/cm$^2$, more preferably greater than 0.1 regions/cm$^2$, even more preferably greater than 1 region/cm$^2$, even more preferably greater than 10 regions/cm$^2$, and still more preferably greater than 100 regions/cm$^2$. In most preferred embodiments, scanning detection systems are preferably utilized to screen an array of resulting materials wherein the density of regions per unit area will be greater than 1,000 regions/cm$^2$, more preferably 10,000 regions/cm$^2$, even more preferably greater than 100,000 regions/cm$^2$, and still more preferably 10,000,000 regions/cm$^2$.

Accordingly, in a preferred embodiment, the array of resulting materials is synthesized on a single substrate. By synthesizing the array of resulting materials on a single substrate, screening the array for resulting materials having useful properties is more easily carried out. Properties which can be screened for include, for example, electrical, thermal mechanical, morphological, optical, magnetic, chemical, etc. More particularly, useful properties which can be screened for are set forth in Table I, infra. Any resulting material found to possess a useful property can subsequently be prepared on a large-scale.

The properties listed in Table I can be screened for using conventional methods and devices known to and used by those of skill in the art. Scanning systems which can be used to screen for the properties set forth in Table I include, but are not limited to, the following: scanning Raman spectroscopy; scanning NMR spectroscopy; scanning probe spectroscopy including, for example, surface potentialometry, tunnelling current, atomic force, acoustic microscopy, shearing-stress microscopy, ultra fast photo excitation, electrostatic force microscope, tunneling induced photo emission microscope, magnetic force microscope, microwave field-induced surface harmonic generation microscope, non-linear alternating-current tunnelling microscopy, near-field scanning optical microscopy, inelastic electron tunneling spectrometer, etc.; optical microscopy in different wavelength; scanning optical ellipsometry (for measuring dielectric constant and multilayer film thickness); scanning Eddy-current microscope; electron (diffraction) microscope, etc.

More particularly, to screen for conductivity and/or superconductivity, one of the following devices can be used: a Scanning RF Susceptibility Probe, a Scanning RF/Microwave Split-Ring Resonator Detector, or a Scanning Superconductors Quantum Interference Device (SQUID) Detection System. To screen for hardness, a nanoindentor (diamond tip) can, for example, be used. To screen for magnetoresistance, a Scanning RF/Microwave Split-Ring Resonator Detector or a SQUID Detection System can be used. To screen for crystallinity, infrared or Raman spectroscopy can be used. To screen for magnetic strength and coercivity, a Scanning RF Susceptibility Probe, a Scanning RF/Microwave Split-Ring Resonator Detector, a SQUID Detection System or a Hall probe can be used. To screen for fluorescence, a photodetector or a charged-coupled device camera can be used. Other scanning systems known to those of skill in the art can also be used.

TABLE I

EXAMPLES OF PROPERTIES WHICH CAN BE SCREENED FOR

| | |
|---|---|
| ELECTRICAL: | SUPERCONDUCTIVITY |
| | CRITICAL CURRENT |
| | CRITICAL MAGNETIC FIELD |
| | CONDUCTIVITY |
| | RESISTIVITY FOR RESISTIVE FILMS |
| | DIELECTRIC CONSTANT |
| | DIELECTRIC STRENGTH |
| | DIELECTRIC LOSS |
| | STABILITY UNDER BIAS |
| | POLARIZATION |
| | PERMITTIVITY |
| | PIEZOELECTRICITY |
| | ELECTROMIGRATION |
| THERMAL: | COEFFICIENT OF EXPANSION |
| | THERMAL CONDUCTIVITY |
| | TEMPERATURE VARIATION |
| | VOLATILITY & VAPOR PRESSURE |
| MECHANICAL: | STRESS |
| | ANISOTROPY |
| | ADHESION |
| | HARDNESS |
| | DENSITY |
| | DUCTILITY |
| | ELASTICITY |
| | POROSITY |
| MORPHOLOGY: | CRYSTALLINE OR AMORPHOUS |
| | MICROSTRUCTURE |
| | SURFACE TOPOGRAPHY |
| | CRYSTALLITE ORIENTATION |
| OPTICAL | REFRACTIVE INDEX |
| | ABSORPTION |
| | BIREFRINGENCE |
| | SPECTRAL CHARACTERISTICS |
| | DISPERSION |
| | FREQUENCY MODULATION |
| | EMISSION |
| MAGNETIC: | SATURATION FLUX DENSITY |
| | MAGNETORESISTANCE |
| | MAGNETORESTRICTION |
| | COERCIVE FORCE |
| MAGNETIC: | PERMEABILITY |
| CHEMICAL: | COMPOSITION |
| | COMPLEXATION |
| | ACIDITY-BASICITY |
| | CATALYSIS |
| | IMPURITIES |
| | REACTIVITY WITH SUBSTRATE |
| | CORROSION & EROSION RESISTANCE |

A more complete description of exemplary methods and apparatus for screening arrays of materials can be found in commonly assigned, co-pending U.S. Provisional application Ser. Nos. 60/016,102, filed Jul. 23, 1996 (Attorney Docket No. 16703-000300), Ser. No. 60/028,106, filed Oct. 9, 1996 (Attorney Docket No. 16703-000310), Ser. No. 60/029,255, filed Oct. 25, 1996 (Attorney Docket No. 16703-000320), Ser. No. 60/035,366, filed Jan. 10, 1997 (Attorney Docket No. 16703-000330), Ser. No. 60/028,105, filed Oct. 9, 1996 (Attorney Docket No. 16703-000400), and Ser. No. 60/035,202, filed Jan. 10, 1997 (Attorney Docket No. 16703-000410), the complete disclosures of which are incorporated herein by reference for all purposes.

What is claimed is:

1. A shutter mask system for use in a substrate processing chamber of the type having a pedestal with a substrate support surface, the shutter mask system comprising:

a frame adapted for coupling a mask system to the processing chamber;

at least two physical masks in said mask system movably mounted to the frame and positioned to form at least one opening between the masks to allow delivery of components through the opening onto a substrate on the pedestal;

one or more drives for moving the physical masks in one or more directions to vary the size, shape and position of the opening relative to the substrate and for generating in a combinatorial fashion an array of resulting materials having composition gradients on said substrate;

a control system coupled to the drives for moving the physical masks during deposition and forming an array of resulting materials on the substrate that differ in composition.

2. A shutter mask system for use in a substrate processing chamber of the type having a pedestal with a substrate support surface, the shutter mask system comprising:

a frame adapted for coupling a mask system to the processing chamber;

at least two physical masks in said mask system movably mounted to the frame and positioned to form at least one opening between the masks to allow delivery of components through the opening onto a substrate on the pedestal;

one or more drives for moving the physical masks in one or more directions to vary the size, shape and position of the opening relative to the substrate and for generating in a combinatorial fashion an array of resulting materials having thickness gradients on said substrate;

a control system coupled to the drives for moving the physical masks during deposition and forming an array of resulting materials on the substrate that differ in thickness.

3. A shutter mask system for use in a substrate processing chamber of the type having a pedestal with a substrate support surface, the shutter mask system comprising:

a frame adapted for coupling a mask system to the processing chamber;

at least two physical masks in said mask system movably mounted to the frame and positioned to form at least one opening between the masks to allow delivery of components through the opening onto a substrate on the pedestal;

one or more drives for moving the physical masks in one or more directions to vary the size, shape and position of the opening relative to the substrate and for generating in a combinatorial fashion an array of resulting materials having stoichiometry gradients on said substrate;

a control system coupled to the drives for moving the physical masks during deposition and forming an array of resulting materials on the substrate that differ in stoichiometry.

4. A shutter mask system for use in a substrate processing chamber of the type having a pedestal with a substrate support surface, the shutter mask system comprising:

a frame adapted for coupling a mask system to the processing chamber;

at least two physical masks in said mask system movably mounted to the frame and positioned to form at least one opening between the masks to allow delivery of components through the opening onto a substrate on the pedestal;

one or more drives for moving the physical masks in one or more directions to vary the size, shape and position of the opening relative to the substrate and for generating in a combinatorial fashion an array of resulting materials having composition, thickness, or stoichiometry gradients on said substrate;

a control system coupled to the drives for moving the physical masks during deposition and forming an array of resulting materials on the substrate that differ in composition, stoichiometry or thickness.

5. The apparatus according to claim 1, 2, 3, or 4, wherein said mask system is adapted for generating at least 20 resulting materials defining said gradients.

6. The apparatus according to claim 1, 2, 3, or 4, wherein said mask system is adapted for generating at least 50 resulting materials defining said gradients.

7. The apparatus according to claim 1, 2, 3, or 4, wherein said mask system is adapted for generating at least 100 resulting materials defining said gradients.

8. The apparatus according to claim 1, 2, 3, or 4, wherein said mask system is adapted for generating at least 500 resulting materials defining said gradients.

9. The apparatus according to claim 1, 2, 3, or 4, wherein said mask system is adapted for generating at least 1000 resulting materials defining said gradients.

10. The apparatus according to claim 1, 2, 3, or 4, wherein said mask system is adapted for generating at least 10,000 resulting materials defining said gradients.

11. The apparatus according to claim 1, 2, 3, or 4, wherein said mask system is adapted for generating at least $10^6$ resulting materials defining said gradients.

* * * * *

UNITED STATES PATENT AND TRADEMARK OFFICE
CERTIFICATE OF CORRECTION

PATENT NO. : 6,045,671
DATED : April 4, 2000
INVENTOR(S) : Xin Di Wu, et. al.

Page 1 of 2

It is certified that error appears in the above-identified patent and that said Letters Patent is hereby corrected as shown below:

Col. 8, line 24
  replace "etc"
  with --etc.--.

Col. 8, line 45
  replace "comprise"
  with --comprises--.

Col. 9, line 32
  replace "relatively"
  with --relative--.

Col. 9, line 63
  replace "000400PC"
  with --000400PC--.

Col. 10, line 37
  replace "componet(s)"
  with --component(s)--.

Col. 12, line 6
  replace "blend"
  with --blends,--.

Col. 13, line 11
  replace "overly"
  with --overlay--.

Col. 19, line 1
  after "mask(s)" insert --is--.

UNITED STATES PATENT AND TRADEMARK OFFICE
CERTIFICATE OF CORRECTION

PATENT NO. : 6,045,671
DATED : April 4, 2000
INVENTOR(S) : Xin Di Wu, et. al.

It is certified that error appears in the above-identified patent and that said Letters Patent is hereby corrected as shown below:

Col. 22, line 6
 replace "substate"
 with --substrate--.

Col. 25, line 11
 replace "patters"
 with --patterns--.

Col. 30, line 21
 between "in" and "field", insert --the--.

Col. 32, line 14
 replace "one."
 with --on.--.

Col. 32, line 15
 replace "ZNS"
 with --ZnS--.

Col. 35, line 32
 replace "Table 1, after OPTICAL"
 with --OPTICAL:--.

Signed and Sealed this

First Day of May, 2001

*Attest:*

NICHOLAS P. GODICI

*Attesting Officer*  *Acting Director of the United States Patent and Trademark Office*